United States Patent
Shea

(10) Patent No.: US 7,093,179 B2
(45) Date of Patent: Aug. 15, 2006

(54) METHOD AND CODING MEANS FOR ERROR-CORRECTION UTILIZING CONCATENATED PARITY AND TURBO CODES

(75) Inventor: John M. Shea, Gainesville, FL (US)

(73) Assignee: University of Florida, Gainesville, FL (US)

( * ) Notice: Subject to any disclaimer, the term of this patent is extended or adjusted under 35 U.S.C. 154(b) by 544 days.

(21) Appl. No.: 10/102,367

(22) Filed: Mar. 20, 2002

(65) Prior Publication Data

US 2002/0147954 A1    Oct. 10, 2002

Related U.S. Application Data

(60) Provisional application No. 60/277,804, filed on Mar. 22, 2001.

(51) Int. Cl.
H03M 13/00    (2006.01)
H03M 13/03    (2006.01)

(52) U.S. Cl. .................. 714/755; 714/758; 714/786

(58) Field of Classification Search ............... 714/752, 714/755, 75, 758, 784, 786
See application file for complete search history.

(56) References Cited

U.S. PATENT DOCUMENTS

| | | | |
|---|---|---|---|
| 4,785,451 A | 11/1988 | Sako et al. | |
| 5,406,570 A | 4/1995 | Berrou et al. | |
| 5,446,747 A | 8/1995 | Berrou | |
| 5,563,897 A | 10/1996 | Pyndiah et al. | |
| 5,729,560 A | 3/1998 | Hagenauer et al. | |
| 5,920,578 A | 7/1999 | Zook | |
| 5,983,384 A | 11/1999 | Ross | |
| 6,023,783 A | 2/2000 | Divsalar et al. | |
| 6,029,264 A * | 2/2000 | Kobayashi et al. | 714/755 |
| 6,122,763 A | 9/2000 | Pyndiah et al. | |
| 6,145,111 A | 11/2000 | Crozier et al. | |
| 6,202,189 B1 * | 3/2001 | Hinedi et al. | 714/786 |
| 6,298,461 B1 * | 10/2001 | Tong et al. | 714/755 |
| 6,381,728 B1 * | 4/2002 | Kang | 714/781 |
| 6,611,940 B1 * | 8/2003 | Markarian et al. | 714/790 |
| 6,795,947 B1 * | 9/2004 | Siegel et al. | 714/802 |

OTHER PUBLICATIONS

Hagenauer, "Forward Error Correcting for CDMA Systems", Spread Spectrum Techniques and Applications Proceedings, 1996, pp. 566-569, vol. 2.

(Continued)

Primary Examiner—Guy Lamarre
Assistant Examiner—Esaw Abraham
(74) Attorney, Agent, or Firm—Saliwanchik, Lloyd & Saliwanchik

(57) ABSTRACT

A method and apparatus for encoding and decoding data using an overall code comprising an outer parity-check and an inner parallel concatenated convolutional, or turbo code. The overall code provides error probabilities that are significantly lower than can be achieved by using turbo codes alone. The output of the inner code can be punctured to maintain the same turbo code rate as the turbo code encoding without the outer code. Multiple parity-check codes can be concatanated either serially or in parallel as outer codes. Decoding can be performed with iterative a posteriori probability (APP) decoders or with other decoders, depending on the requirements of the system. The parity-check code can be applied to a subset of the bits to achieve unequal error protection. Moreover, the techniques presented can be mapped to higher order modulation schemes to achieve improved power and bandwidth efficiency.

42 Claims, 13 Drawing Sheets

OTHER PUBLICATIONS

Jung, "Comparison of Turbo-Code Decoders Applied to Short Frame Transmission Systems", *IEEE Journal on Selected Areas in Communications*, 1996, pp. 530-537, vol. 14, No. 3.

Tee et al., "Multiple Serially Concatenated Single Parity Check Codes", Communications 2000, pp. 613-617, vol. 2.

Wang et al., "On Design of Interleavers with Practical Size for Turbo Codes", Communications, 2000, pp. 618-622, vol. 2.

J.D. Andersen, "'Turbo' coding for deep space applications," *Proceedings of the 1995 IEEE International Symposium on Information Theory*, (Whistler, BC, Canada), p. 36, Sep. 1995.

J.D. Andersen, "Turbo codes extended with outer BCH code," *IEE Electronics Letters*, vol. 32, No. 22, pp. 2059-2060, Oct. 1996.

K.R. Narayanan and G.L. Stuber, "Selective serial concatenation of turbo codes," *IEEE Communications Letters*, vol. 1, pp. 136-139, Sep. 1997.

H.C. Kim and P.J. Lee, "Performance of turbo codes with single-error correcting BCH outer code," *Proceedings of the 2000 IEEE International Symposium on Information Theory*, Sorento, Italy), p. 369, Jun. 2000.

O.Y. Takeshita et al., "On the frame-error rate of concatenated turbo codes," *IEEE Transactions on Communications*, vol. 49, pp. 602-608, Apr. 2001.

D.J. Costello, Jr. and G. Meyerhans, "Concatenated Turbo Codes," *Proceedings of the 1996 IEEE International Symposium on Information Theory and Its Applications*, (Victoria, BC, Canada), pp. 571-574, Sep. 1996.

M.C. Valenti, "Inserting turbo code technology into the DVB satellite broadcasting system," *Proceedings of the 2000 IEEE Military Communications Conference*, (Los Angeles), vol. 2, pp. 650-654, Oct. 2000.

G. Caire, G. Taricco, and G. Battail, "Weight distribution and performance of the iterated product of the single-parity-check codes," *Proceedings of the 1994 Global Telecommunications Conference*, pp. 206-211, 1994.

J. Hagenauer, E. Offer, and L. Papke, "Iterative decoding of binary block and convulotional codes," *IEEE Transactions on Information Theory*, vol. 42, pp. 429-445, Mar. 1996.

L. Ping, S. Chan, and K.L. Yeung, "Efficient soft-in soft-out sub-optimal decoding rule for single parity check codes," *IEEE Electronics Letters*, vol. 33, pp. 1614-1616, Sep. 1997.

L. Ping, S. Chan, and K.L. Yeung, "Iterative decoding of multi-dimensional concatenated single parity check codes," *Proceedings of the 1998 International Conference on Communication*, vol. 1, pp. 131-135, 1998.

D.M. Rankin and T.A. Gulliver, "Single parity check product codes," *IEEE Transactions on Communications*, vol. 49, pp. 1354-1362, Aug. 2001.

C. Berrou, A. Glavieux, and P. Thitimajshima, "Near Shannon limit error-correcting coding and decoding," in *Proceedings 1993 IEEE International Conference on Communications*, (Geneva, Switzerland), pp. 1064-1070, 1993.

L. R. Bahl, J. Cocke, F. Jelinek, and J. Raviv, "Optimal decoding of linear codes for minimizing symbol error rate", *IEEE Transactions on Information Theory*, vol. IT-20, pp. 284-287, Mar. 1997.

T. F. Wong and J. M. Shea, "Multi-dimensional parity-check codes for bursty channels," in *Proceedings 2001 IEEE International Symposium on Information Theory*, (Washington, D.C.), p. 123, Jun. 2001.

J. M. Shea, "Improving the performance of turbo codes through concatenation with rectangular parity-check codes," in *Proceedings 2001 IEEE International Symposium on Information Theory*, (Washington, D.C.), p. 144, Jun. 2001.

J. M. Shea and T. F. Wong, "Concatenated codes based on multi-dimensional parity-check codes and turbo codes," in *Proceedings of the 2001 IEEE Military Communications Conference*, (Washington, D.C.), vol. 2, pp. 1152-1156, Oct. 2001.

J. M. Shea and T. F. Wong, "Reduced-complexity decoding for concatenated codes based on rectangular parity-check codes and turbo codes," in *Proceedings of the 2001 IEEE Global Communications Conference*, (San Antonio, TX), pp. 1031-1035, Nov. 2001.

J. Han and O. Y. Takeshita, "On the decoding structure for multiple turbo codes," in *Proceedings of the 2001 IEEE International Symposium Information Theory*, (Washington, D.C.), p. 98, Jun. 2001.

S. Benedetto, D. Divsalar, G. Montorsi and F. Pollara, "Bandwidth efficient parallel concatenated coding schemes," *Electronics Letters*, vol. 31, pp. 2067-2069, Nov. 1995.

P. Robertson and T. Worz, "Coded modulation scheme employing turbo codes," *Electronics Letters*, vol. 31, pp. 1546-1547, Aug. 1995.

S. Bendetto, D. Divsalar, G. Montorsi and F. Pollara, "Serial concatenation of interleaved codes: performance analysis, design, and iterative decoding," *IEEE Transactions on Information Theory*, vol. 44, pp. 909-926, May 1998.

\* cited by examiner

Example of Shuffling

Original Bit Order

| 1 | 2 | 3 | 4 | 5 |
|---|---|---|---|---|
| 6 | 7 | 8 | 9 | 10 |
| 11 | 12 | 13 | 14 | 15 |
| 16 | 17 | 18 | 19 | 20 |
| 21 | 22 | 23 | 24 | 25 |

Shuffled Bit Order

| 1 | 7 | 13 | 19 | 25 |
|---|---|---|---|---|
| 12 | 18 | 24 | 5 | 6 |
| 23 | 4 | 10 | 11 | 17 |
| 9 | 15 | 16 | 22 | 3 |
| 20 | 21 | 2 | 8 | 14 |

METHOD AND CODING MEANS FOR ERROR-CORRECTION UTILIZING CONCATENATED PARITY AND TURBO CODES

CROSS-REFERENCE TO A RELATED APPLICATION

This application claims the benefit of U.S. Provisional Application No. 60/277,804, filed Mar. 22, 2001, incorporated herein by reference.

FIELD OF THE INVENTION

The present invention relates to error correcting schemes and, more particularly, to a novel error correcting code that uses concatenated parity-check codes as outer codes and turbo codes as inner codes.

BACKGROUND OF THE INVENTION

Advances in error-correcting codes, such as convolution codes and trellis codes, have enabled designers of digital communications systems to achieve increased bit rates for a given level of error rate performance. One of the most significant developments in the area of digital error correcting codes are the recursive convolution codes collectively known as "turbo codes." Turbo codes operate by combining a plurality of encoders with permuters to iteratively encode data to improve performance using a corresponding number of soft input/soft output decoders which operate iteratively.

An early description of turbo codes appears in C. Berrou, et. al, "Near Shannon limit error-correcting coding and decoding: Turbo codes," Proc. 1993 Int. Conf. Communication (Geneva, Switzerland, May 1993), pp. 1064–1070. Berrou, et. al discloses a parallel-concatenated turbo code. The input data is applied to a first convolutional encoder and an interleaved version of the input data is applied to a second convolutional encoder. Some of the redundant bits generated by the encoders may be subjected to a puncturing prior to the mapping step in order to improve bandwidth efficiency.

While turbo codes can reduce the level of received signal-to-noise ratio to achieve a desired level of error rate performance, the complexity of turbo codes can create significant end-to-end delay, or latency, which is undesirable in many applications. In addition, parallel concatenated turbo codes, like the one described in Berrou, exhibit an error floor phenomenon wherein the improvement in coding gain is far less dramatic at lower error rates and may be comparable to, or even worse than, the lower error rates achieved using more conventional encoding and decoding.

Serial concatenated turbo codes have also been suggested as disclosed by S. Benedetto, et al, in "Serial concatenation of interleaved codes: Performance analysis, design, and iterative decoding," IEEE Trans. Inform. Theory, vol. 44, pp. 909–926, May 1998. In a serially concatenated turbo code, the input data is applied to a first convolutional encoder and the output bits of the first encoder, after interleaving, are used as the input bits for a second convolutional encoder. The error floor phenomenon associated with parallel-concatenated turbo codes is less pronounced for serial-concatenated turbo codes, thereby providing better coding gain at lower error rates. However, the performance of these codes in the low signal-to-noise regions is generally not as good as turbo codes. Furthermore, these serial-concatenated turbo codes generally generate more redundant bits than in the parallel case, so that they are less bandwidth-efficient. Moreover, they too require prohibitive complexity with associated delays.

Neither the parallel-concatenated nor the serial-concatenated turbo codes described above are bandwidth efficient; each of the designs has a bandwidth efficiency of less than two bits per two-dimensional signal point when used with quadrature phase-shift-key (QPSK) modulation. More bandwidth-efficient parallel concatenated turbo codes have been designed, including, for example, "Bandwidth efficient parallel concatenated coding schemes," by S. Benedetto, et al, Electron. Lett., vol. 31, pp. 2067–2069, 1995, and P. Robertson, et al, and "Coded modulation scheme employing turbo codes," Electron. Lett., vol. 31, pp. 1546–1547, 1995. The arrangements described in these references achieve high coding gains at high error rate while featuring an improved bandwidth efficiency of a full 2 bits per 2D signal point by using rate-2/3 trellis codes designed jointly with a 2D 8-PSK signaling constellation in contrast to the convolutional codes with the 2D 4-PSK constellation used in the Berrou design. However, the Benedetto codes still exhibit the undesirable error floor phenomenon and associated long delays.

Moreover, the error floor tends to occur at high error probabilities when the turbo code is based on very simple constituent codes and when the block length is short (generally from several hundred to several thousand bits). For wireless communication systems, short block lengths and simple constituent codes are usually required. One motivation for these requirements is to keep the decoder simple enough to implement the decoding in a cost-effective manner. The complexity of the decoder has currently limited the application of turbo codes to the reverse link, so that the turbo decoder is implemented in hardware at the base station. In addition, turbo codes can be used in hybrid automatic repeat request (ARQ) schemes that use code combining, but these methods have not been implemented in any of the current telecommunication standards. One probable reason for this is that previously proposed code-combining ARQ techniques all require additional iterative maximum a posteriori (MAP) decoding of the entire packet when additional code symbols are received. This additional iterative decoding results in significantly higher processing requirements and longer delays. Thus, it desirable to consider other code structures that can provide similar or better performance than turbo codes while also reducing the complexity.

To overcome the inherent limitations of turbo codes, several authors have suggested the use of an outer code error correction code with a turbo inner code. J. D. Andersen suggested the use of an outer Bose-Chaudhuri-Hochquenghem (BCH) cyclic, error-correcting, code in the *Proceedings of the* 1995 *IEEE International Symposium on Information Theory* and the October Issue of *IEE Electronics Letters*. Narayanan and Stuber suggested a variation on this scheme in the September 1997 issue of *IEEE Communications Letters*. Kim and Lee considered a variation of the BCH outer code in the *Proceedings of the* 2000 *IEEE International Symposium on Information Theory*, as did Takeshita et al in the April 2001 *IEEE Transactions on Communications*. A Reed-Solomon (a type of non-binary BCH) code was used an outer code with a turbo inner code by Costello et al in the *Proceedings of the* 1996 *IEEE International Symposium on Information Theory and Its Applications* and by Valenti in the *Proceedings of the* 2000 *IEEE Military Communications Conference*.

In addition, single parity-check codes and concatenations of single parity-check codes have been investigated by many authors, including Caire et al in the *Proceedings of the 1994 Global Telecommunications Conference*, Hagenauer et al in the March 1996 *IEEE Transactions on Communications*, Ping et al in the September 1997 *IEE Electronics Letter and the Proceedings of the 1998 IEEE International Conference on Communications*, and Rankin and Gulliver in the August 2001 *IEEE Transactions on Communications*.

However, while mitigating the inherent problems of using a turbo code alone, the above proposed paired inner and outer error correcting codes suffer from a significant reduction in code rates and fail to utilize the soft-outputs of the turbo decoder. Therefore, there is a need in the art to provide a new error-correcting code comprising an outer code error correction code with a turbo inner code that can significantly outperform existing coding schemes without requiring a significant reduction in code rate.

The following patents, describing various error coding schemes, are incorporated herein by reference to the extent they are not inconsistent with the disclosure, teachings, and principles of the subject invention: U.S. Pat. Nos. 4,785,451; 5,406,570; 5,446,747; 5,563,897; 5,729,560; 5,920,578; 5,996,104; 6,023,783; 6,028,897; 6,122,763; and 6,351,832.

All patents, patent applications, provisional applications, and publications referred to or cited herein, or from which a claim for benefit of priority has been made, are incorporated herein by reference in their entirety to the extent they are not inconsistent with the explicit teachings of this specification.

BRIEF SUMMARY OF THE INVENTION

The present invention solves the above-stated problems in the art by providing a system and method for a novel error-correcting code that uses concatenated parity-check codes as outer codes and parallel concatenated convolutional codes (turbo codes) as inner codes. In particular, this invention is distinguished from other coding schemes that use an outer code with an inner turbo code by the use of very high-rate outer codes that are constructed from concatenating multiple single parity-check codes and by the use of soft-decision or pseudo-soft-decision decoding algorithms that are used in decoding these outer codes. The outer parity-check codes will typically be formed by placing the information bits into a matrix and computing the single parity of bits in submatrices of the original matrix. The output of the inner code can be punctured so that the concatenated parity-check and turbo code can maintain the same rate as the turbo code without the outer code. Multiple parity-check codes may be concatenated either serially or in parallel as outer codes.

Decoding can be performed with iterative a posteriori probability (APP) decoders or with other decoders, depending on the requirements of the system. The parity-check code can be applied to a subset of the bits in order to achieve unequal error protection. Moreover, the techniques can be mapped to higher order modulation schemes to achieve greater power and bandwidth efficiency.

The coding scheme may be used in many wireless communication schemes, such as wireless local area networks, satellite communications, fixed wireless links, cellular communications, military communications, and the like. The scheme may also have application in wire-line communication systems, such as digital subscriber line (DSL). The scheme may be particularly useful for communications providers that are transmitting data over links that may not have a reverse link, such as for deep space communications. These codes also have advantages for use in storage systems, such as magnetic and optical storage systems.

The invention can be implemented in numerous ways, including as a system, a method, an apparatus, a computer readable medium, a computer program product, or a data structure tangibly fixed in a computer readable memory. The methods of the present invention may be implemented as a computer program product with a computer-readable medium having code thereon. The program product includes a program and a signal bearing media bearing the program. As an apparatus, the present invention may include at least one processor, a memory coupled to the processor, and a program residing in the memory which implements the methods of the present invention.

In view of the foregoing, it is an object of the present invention to provide a new error-correcting code comprising an outer parity-check code and an inner turbo code that can significantly outperform existing coding schemes without requiring a significant reduction in code rate. It is yet another object of the present invention to provide a plurality of outer parity-check encoders operating in parallel and separated by permuters. It is yet another object of this invention to provide plurality of outer parity-check encoders operating in series. It is still another object of this invention to provide a shuffling permuter (shuffler) to enhance the performance of an error correcting code by preventing the entries in a rectangular array from ending up in the same row or column as the original array after permutation. It still yet another object of this invention to decode a serial concatenated error correcting code by iteratively exchanging soft decision information between a parity-check decoder and a turbo decoder using soft decision feedback. It is still another object of the invention to decode serially concatenated error correcting code using a non-iterative decoding process between an internally iterating turbo code decoder and a parity-check decoder. It is another object of this invention to provide a parity-check encoder to encode a fractional portion of the information bits encoded by a corresponding turbo code encoder. It is yet another object of the invention to provide error correction encoding in which a block of digital data is encoded using a parity-check encoder and a turbo encoder operating in parallel and in which the encoded bits at the output of the parity-check encoder are transmitted only if the turbo decoder's output has errors.

The advantages of the invention are numerous, including a novel error-correcting code that can outperform existing coding without sacrificing a significant reduction in coding rate. Another advantage of the invention is that the proposed concatenated error correcting codes provide error probabilities that are significantly lower then can be achieved by using only turbo codes. A further advantage is that the decoder for the outer code is very simple compared to the decoder for the inner code, so that the coding scheme does not require a significant increase in decoder complexity. Increased energy efficiency may also be achieved, which allows greater utilization of communication links, more efficient use of power, and lower interference levels. The use of the outer parity-check codes also makes possible some new forms of unequal error-protection coding and hybrid automatic repeat request (ARQ) coding.

Other aspects and advantages of the invention will become apparent from the following detailed description taken in conjunction with the drawings, illustrating by way of example the principles of the invention.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

FIG. 7 is a diagram that illustrates the input and output bit orderings for the shuffling algorithm that is described in the present invention applied to a 5 by 5 input array of 25 bits;

Figure 1:
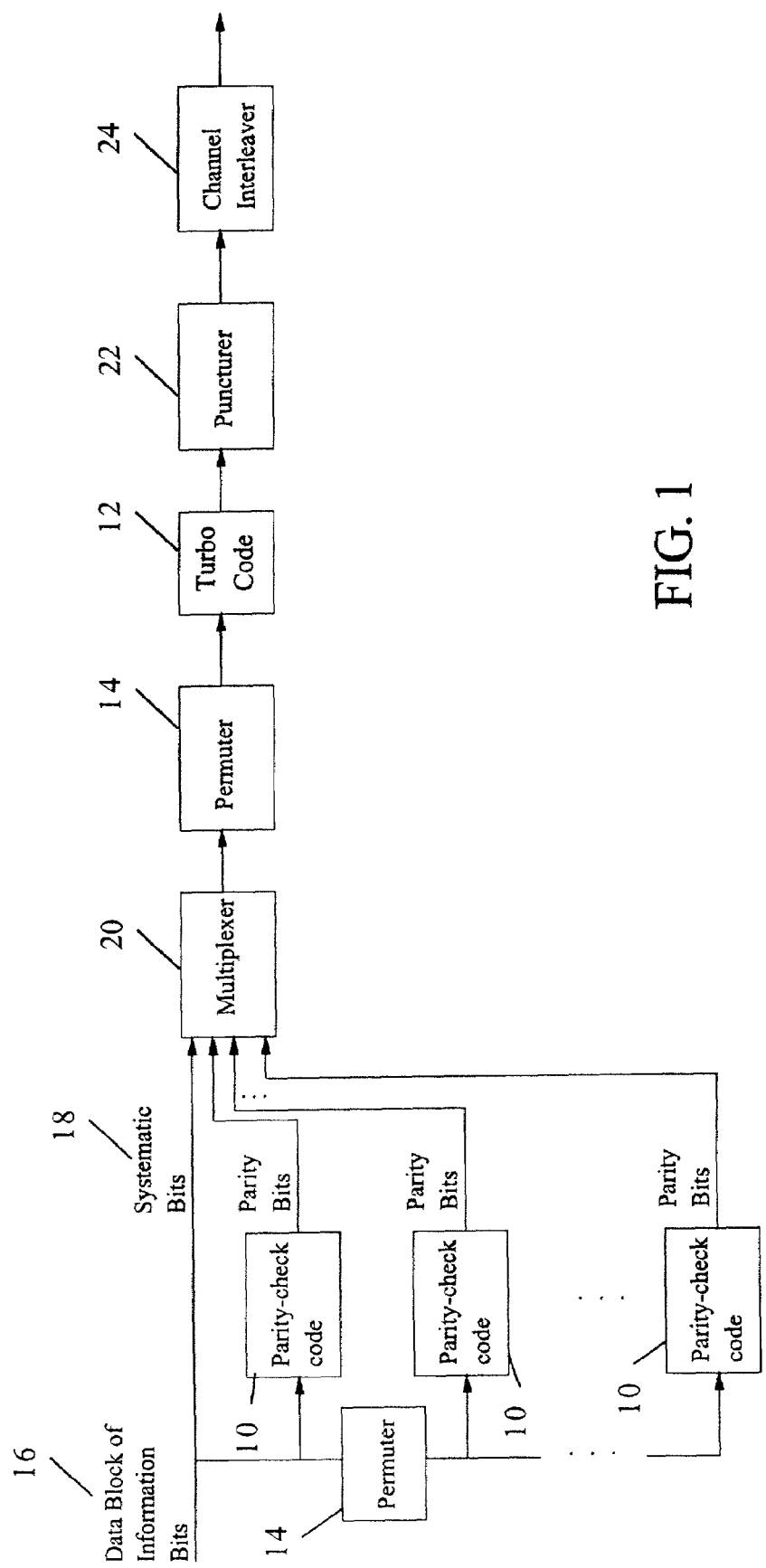
FIG. 1 is a block diagram of an encoder according to the present invention.

It should be understood that in certain situations for reasons of computational efficiency or ease of maintenance, one skilled in the art could rearrange the ordering and relationships of the blocks of the illustrated block diagrams. While the present invention will be described with reference to the details of the embodiments of the invention shown in the drawings, these details are not intended to limit the scope of the invention.

DETAILED DISCLOSURE OF THE INVENTION

The present invention solves the problems in the art by providing a system and method for a novel error-correcting code that uses concatenated parity-check codes as outer codes and parallel concatenated convolutional codes (turbo codes) as inner codes.

Reference will now be made in detail to the embodiments consistent with the invention, examples of which are illustrated in the accompanying drawings. Wherever possible, the same reference numerals used throughout the drawings refer to the same or like parts.

I. Serially Concatened Inner Turbo Code and Outer Parity-Check Encoders

Figure 2:
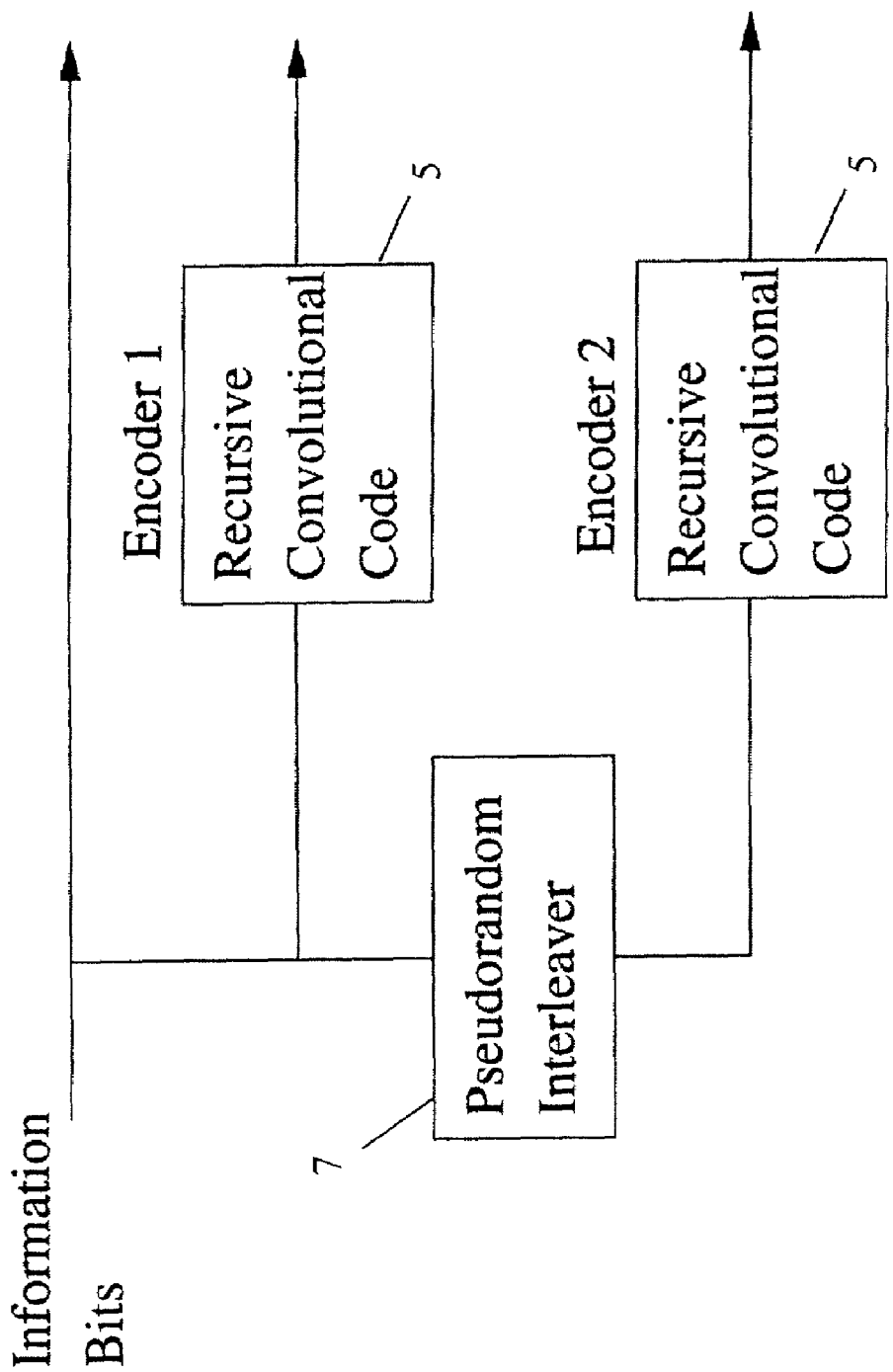
FIG. 2 is a block diagram of the encoder for a typical rate 1/3 turbo code.

FIG. 1 shows a preferred encoding scheme according to the present invention. In this encoding scheme, one or more parity-check codes 10 are used as outer codes in a hybrid serial/parallel concatenated coding scheme. The combination of all the outer parity-check codes 10 (including the systematic bits 18) is serially concatenated with an inner code turbo code 12, such as the rate 1/3 turbo code illustrated in FIG. 2. As depicted in FIG. 2, a turbo code 12 is a parallel-concatenated convolutional code that uses systematic recursive convolutional codes 5 separated by turbo code interleavers 7, or permuters, with random (not shown) or pseudorandom properties. The rate, memory, and interleaver design for the turbo code 12 may be chosen to enhance the performance of the overall coding scheme within the constraints of the desired overall code rate and implementation complexity. Returning now to FIG. 1, the turbo code 12 that is to be used with an outer parity-check code 10 may be different than a turbo code that would be used with no outer code. In particular, the turbo code 12 may be constructed from constituent codes with non-primitive feedback polynomials that offer better convergence properties but have larger enumerations of the low-weight error events. The use of the outer parity-check code 10 in the current invention advantageously reduces the enumeration of the low-weight error patterns associated with the turbo code 12. In addition, the design of a turbo code permuter may be different in the presence of an outer code. Turbo code permuters that are designed to reduce the presence of low-weight error events for turbo codes, such as S-random turbo code permuters, typically offer worse convergence properties. Turbo code permuters that have some amount of regular structure may be effective with outer codes to offer a good compromise between decoder convergence and low-weight error events. The turbo code 12 may also be modified in other ways to improve its convergence properties. Examples of modifications to the turbo code 12 include the use of repetition on some of the bits at the input to the encoder or the insertion of known bits at the input to the decoder. One who is skilled in the art may choose other modifications to the basic structure of the turbo code.

Moreover, one who is skilled in the art may choose to implement the parity-check codes 10 using single parity-check codes, rectangular parity-check codes, or higher-dimension parity-check codes. These parity-check codes 10 may be separated from each other and from the turbo code 12 using permuters 14 that may be pseudorandom or deterministic in nature. The choices of permuters 14 will affect the performance of the coding scheme. As illustrated in FIG. 1, the parity-check codes 10 may be concatenated in parallel to form a product-code, such as a rectangular parity-check code described below and illustrated in FIG. 3; or may be concatenated in series. As an alternative embodiment of the outer parity-check code/inner turbo code structure, the parity-check codes may be directly concatenated with the recursive convolutional codes to provide different constituent codes for the turbo code.

According to the preferred embodiment, a data block of information bits 16 is received at the encoder of FIG. 1. Parity bits are generated from the received information bits by the parity-check encoders 10 and multiplexed together with the originally received block of information bits, or systematic bits 18 in a multiplexer 20 to form an input data block for the turbo code 12. As previously mentioned, this input block may be interleaved by a permuter 14 before input to the turbo code 12. Preferably, at the output of the turbo code 12, the output bits are permuted or interleaved by a channel interleaver 24 to break up the effect of any memory in the channel. In addition, the output of the encoder may also be punctured, as is known in the art, by a puncturer 22 to change the rate of the overall code. One reason to puncture the code is to provide the ability to add parity-check codes to a system without reducing the code rate. Furthermore, another reason to puncture the code is to influence the error probabilities when the parity codes 10 are used to achieve unequal error protection, as is described later in this description. It should be noted however, that neither puncturing nor channel interleaving are absolutely required for the invention.

II. Rectangular Parity-Check Outer Codes

Figure 3:
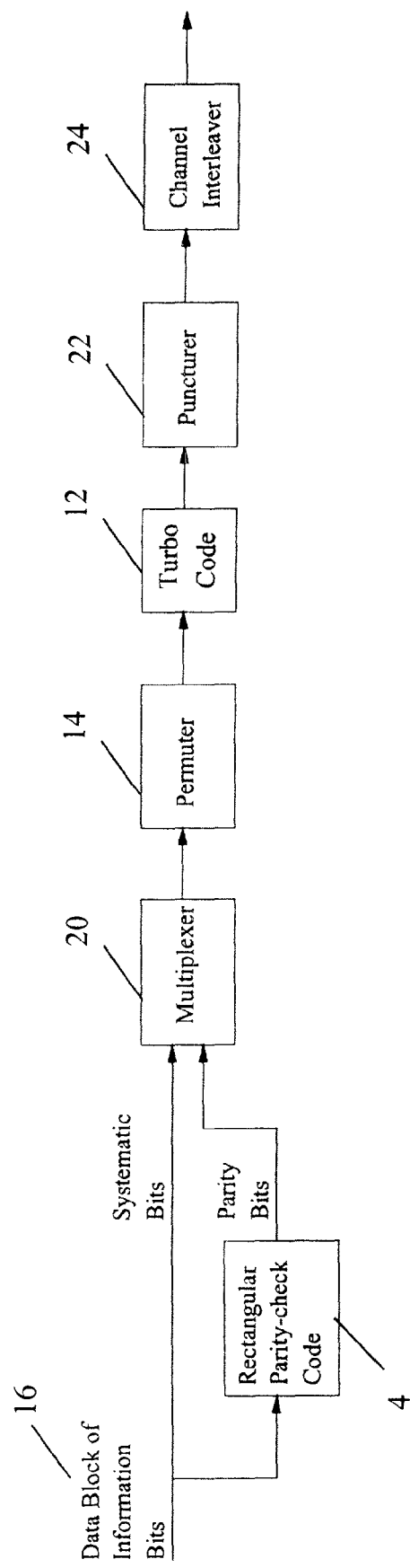
FIG. 3 is a block diagram of an encoder that incorporates the present invention and uses one rectangular parity-check code.

A preferred embodiment of the outer code of a concatenated inner and outer encoder will now be described. FIG. 3 illustrates a preferred embodiment of the present invention that uses a rectangular parity-check code (RPCC) 4 as the outer code. A data block of information bits 16 is received at the encoder of FIG. 3. Parity bits are generated from the received information bits by an RPCC 4 and multiplexed together with the systematic bits 18 in a multiplexer 20 to form an input data block for the turbo code 12. The input data block may be interleaved by a permuter 14 before input to the turbo code 12. Preferably, at the output of the turbo code 12, the output bits are permuted or interleaved by a channel interleaver 24 to break up the effect of any memory in the channel. In addition, the output of the encoder is also be punctured, as is known in the art, by a puncturer 22 to change the rate of the overall code. However, neither puncturing nor channel interleaving are absolutely required for this embodiment of the invention.

The RPCC 4 is a type of block product code, and therefore, a concatenated code. In an RPCC 4, parity bits are calculated on both rows and columns of a rectangular matrix. One who is skilled in the art may construct the RPCC 4 using two parallel single parity-check codes separated by a rectangular interleaver. In general, any higher-dimension parity-check code may be implemented using single parity-check codes and appropriate permuters, so the use of parity-check codes of higher dimension with turbo codes is envisioned by the present invention. Moreover, parity-check codes with more than two dimensions can be encoded by placing the information bits into a matrix with more than two dimensions and then computing the parity bits on sub-matrices. In one embodiment, a parity bit is computed for each set of parity bits that lie on a line of a sub-matrix of one dimension. In another embodiment, for a matrix of M dimensions, a parity bit is computed for sub-matrices of dimension M−1.

Figure 4:
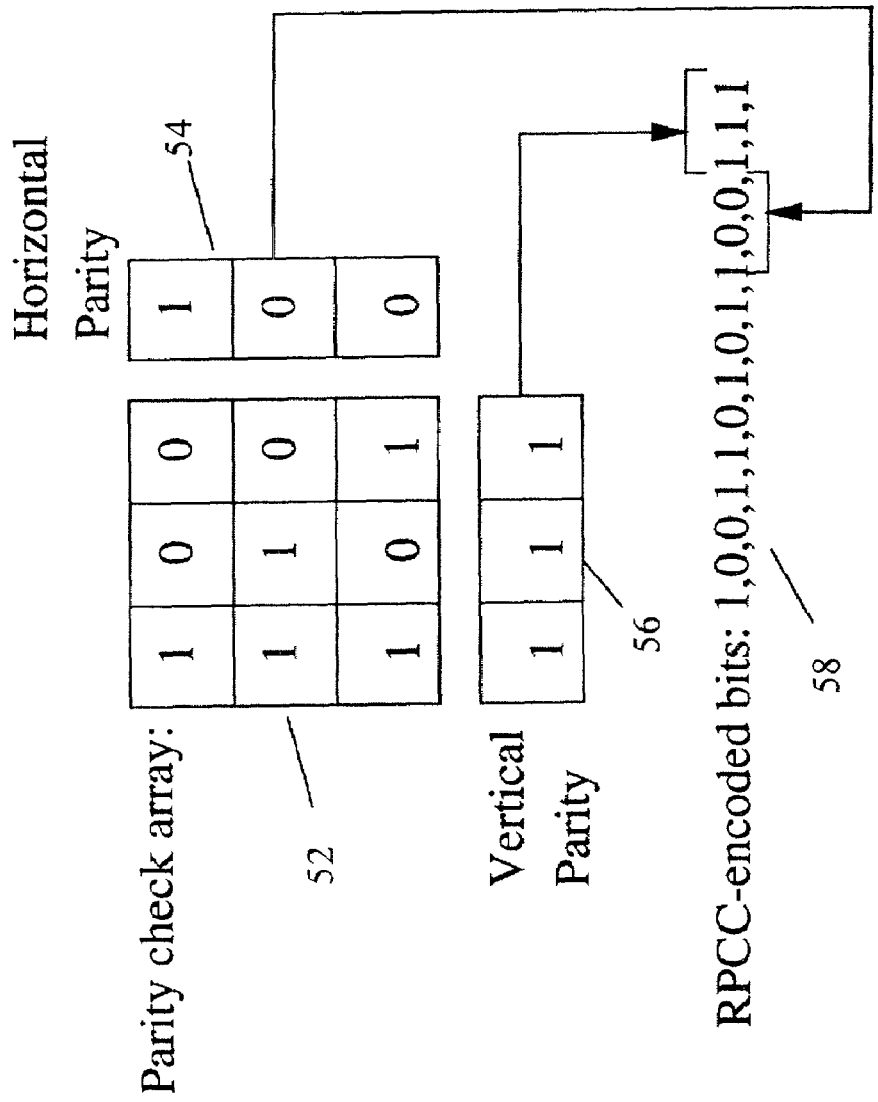
FIG. 4 is a representation of the operation of a rectangular parity-check encoder for a 3 by 3 code.

As mentioned above, an RPCC may be generated by placing the information bits into a rectangular array and then calculating the parity for each row and column. An RPCC for a packet of nine bits is illustrated in FIG. 4, wherein the parity bits are computed using even parity. The data bits 50 are placed into a square parity-check array 52 of dimension 3. Horizontal parity, for example using even parity, is calculated for each row of the parity-check array 52 and the calculated horizontal parity bit is placed in a horizontal parity vector 54 element location corresponding to the row for which horizontal parity was calculated. Similarly, vertical parity, for example using even parity, is calculated for each column of the parity-check array 52 and the calculated column parity bit is placed in a vertical parity vector 56 element location corresponding to the column for which the vertical parity was calculated. The calculated parity bits are then preferably appended to the end of the data bits 50 to create an RPCC encoded bit stream 58.

In general, for a data packet of $N^2$ bits with a square parity-check matrix, the number of parity bits is 2N, or N bits each in the horizontal and vertical directions. Thus, the rate of an RPCC code is calculated using the formula:

$$N^2/(N^2+2N)=N/(N+2).$$

The rate of the RPCC code is an important factor in the performance of the overall concatenated coding scheme that comprises a parity-check codes and a turbo code. As the value of N becomes large, the rate of the RPCC code approaches 1.0, which effectively eliminates any rate penalty incurred by using a parity-check code in conjunction with a turbo code. Moreover, parity-check codes of higher dimension can produce codes that have good distance properties while also achieving higher rates.

Figure 5:
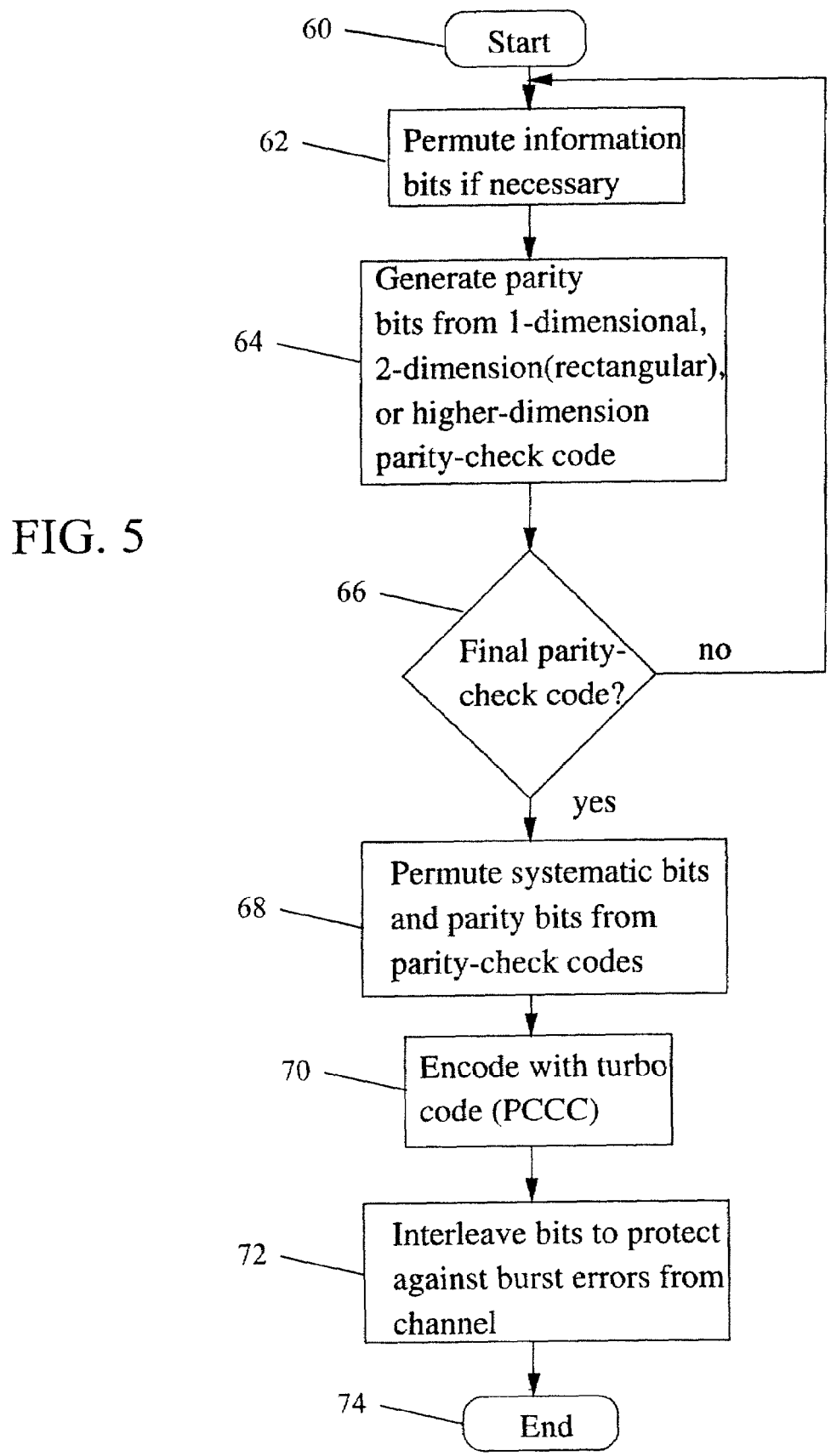
FIG. 5 is a flow chart that further illustrates the encoding operation involved in the present invention.

The flow diagram in FIG. 5 provides further description of the encoding process for an inner and outer code encoder that employs parallel concatenation of the parity-check codes where more than one parity-check code is employed. The process starts 60 with reception of a data block of information bit. Next, the received block of information bits are permuted as necessary 62 and then input to one or more parity-check codes that then generate parity bits 64. The parity-check codes may be a single parity-check, rectangular parity-check, or higher-dimension parity-check codes. The process of permuting 62 and generating parity bits 64 is repeated until the final parity-check code is complete 64. After all of the additional parity bits are generated for the various parity-check codes, the information bits and parity bits are permuted 68 and input to the turbo code for encoding 70. The output of the turbo code is preferably interleaved 72 to improve performance on channels that have memory, such as inter-symbol interference, fading, or burst-error channels. The encoding process ends in step 74.

III. Rectangular Parity-check Shufflers

If the rectangular parity-check code 4 as shown in FIG. 3, is used in the encoding process, then the permuter 14 can be advantageously designed to improve the performance of the overall code by incorporating a permuting process herein referred to as "shuffling." The performance of the rectangular parity-check code may be degraded if errors tend to occur within rows or columns of the matrix. In particular, turbo codes tend to exhibit errors within a row because information bits are not permuted before encoding by one of the encoders, and thus, error events at the decoder become a combination of error events for both encoders. A random rectangular permuter cannot always solve this problem because a random permuter might fail to resolve errors that occur in the same row. Commonly, error events for each of the encoders in a turbo code consist of two erros separated by several correct bits. Thus, if an error occurs in a row, it becomes likely that another error also occurs in that row. Therefore, according to a preferred embodiment of the invention, a non-random permitter, or shuffler, attempts to prevent entries in the original rectangular parity array from ending up in the same row or column after the permutation. If this cannot be achieved, then entries that remain in the same row or column will be separated as much as possible.

Figure 6:
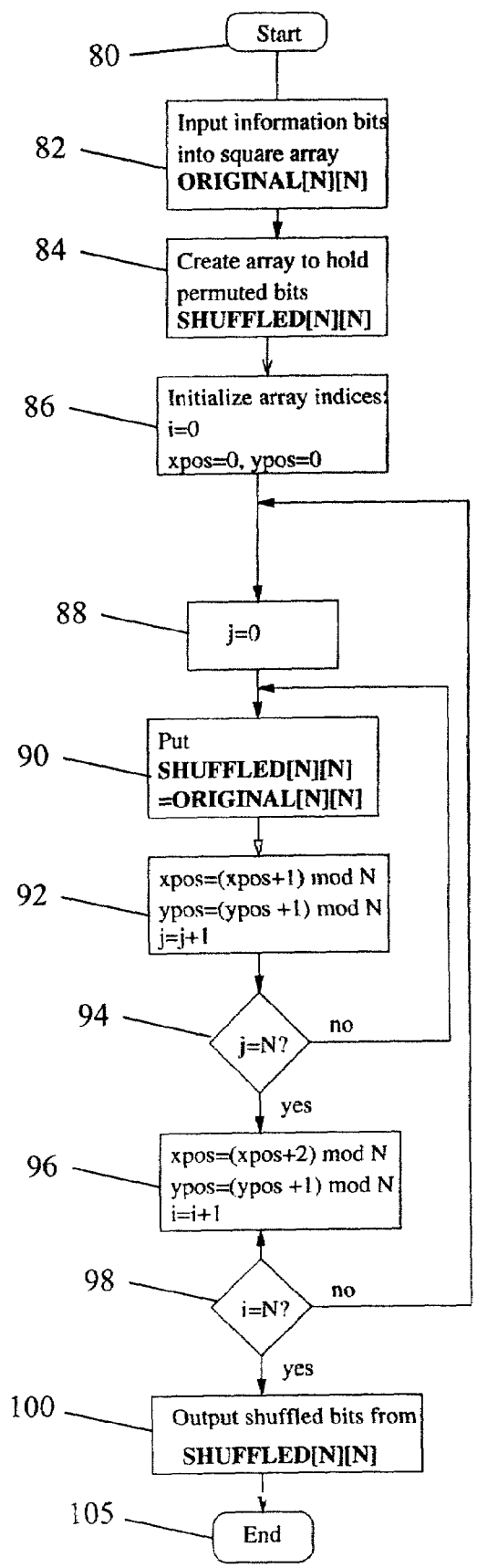
FIG. 6 is a flow chart that illustrates the shuffling operation that is described in the present invention.

The shuffler is a systematic way of avoiding errors that are correlated in position at the output of a decoder for the inner code. The shuffler can help achieve these goals by moving the elements into diagonals of an array. The shuffler rearranges the entries in a square array so that no entry in the shuffled array is in the same row or column as an entry that is in the same row or column as the entry in the original array. Generally, the shuffling process starts by sequentially populating a square array with a block of information bits. Then, beginning at the entry in the first row and first column of the original square array, the shuffler reads the entries along the diagonal of the original square array. For example, after reading entry x,y, the shuffler moves to entry x+1, y+1, and wraps back around to stay within the confines of the array, preferably using modulo arithmetic. For each diagonal in the original square array, the shuffler stores the elements of the diagonal into the first row of the shuffled array. At then end of the diagonal, the shuffler moves back to the first row and first column of the original array, which is the starting point for the previous diagonal. Then the shuffler moves down j rows and over k columns, where typically j=1 and k=2. The values of j and k may be changed to ensure that the permuter has the desired properties. The shuffler reads the diagonal starting from the new position into the next row of the shuffled array. Then the shuffler moves back to the starting point for the current diagonal and again moves down j rows and over k columns, wrapping back around as necessary. This process continues until all of the entries in the original array have been read into the shuffled array. Specifically the shuffler is implemented as shown in the flow chart of FIG. 6.

The shuffling process starts 80 by inputting information bits into a square array 82 and forming a new square array 84 to store the shuffled entries. Next, array indices are initialized 86, including a first counter for the dimension of the array, an index for the current row position of the array element, and an index for the current column position. The following steps are then iteratively performed until the first counter reaches a terminal value of the dimension of the array. Within the first iteration loop, a second counter for the dimension of the array is initialized 88 and a second iterative loop is performed until the second counter reaches a terminal value of the dimension of the array. While in the second iterative loop, the current original array element is put into the current shuffled array element location 90. Then, the index for the current row position of the array element is incremented by 1, modulus dimension of the first square array; the index for the current column position is incremented by 1, modulus dimension of the first square array; and the second counter is incremented by 1 92. The second iteration loop is executed, starting from step 90, until the second counter reaches the value of the dimension of the array 94.

Upon exiting the second iteration loop, the index for the current row position of the array element is incremented by 2, modulus dimension of the first square array; the index for the current column position is incremented by 1, modulus dimension of the first square array; and the first counter is incremented by 1 96. The first iteration loop is then executed, starting from step 88, until the first counter reaches the value of the dimension of the array 98. Upon termination of the first iteration loop, the array of shuffled elements are output 100 and the process ends 105. FIG. 7 illustrates the bit orderings that result from applying the shuffling algorithm to a square array of 25 elements.

IV. Concatenated Inner Turbo Code and Outer Parity-check Decoders

In the description of the concatenated inner turbo code and outer parity-check decoders that follows, we refer to the concatenation of all of the parity-check codes and the turbo code as the "overall code." The decoding algorithm used for the overall code may be one of several algorithms and may be classified into two groups: 1) overall-iterative algorithms and 2) overall-non-iterative algorithms. Overall-iterative algorithms iterate between a turbo decoder and a parity-check decoder or decoders, usually passing some form of extrinsic information between the decoders. Conversely, overall-non-iterative algorithms do not iterate between the turbo decoder and the parity-check decoder or decoders. Regardless of whether overall-iterative or overall-non-iterative decoding is employed, iterative decoding is preferably used in the turbo decoder and between the parity-check decoder or decoders.

Figure 8:
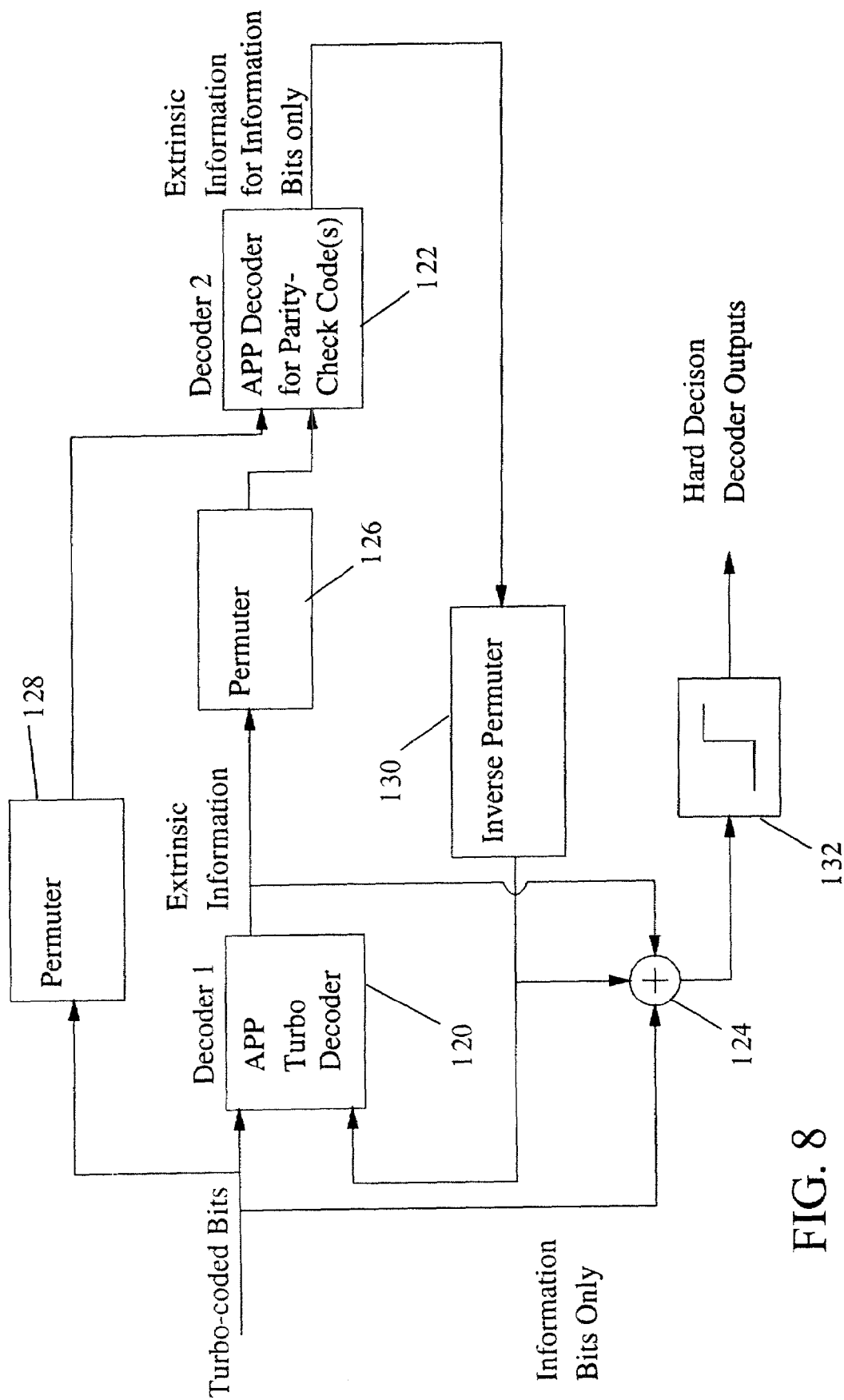
FIG. 8 is a block diagram that illustrates an iterative decoder that iterates between soft-input, soft-output decoders for the turbo code and parity-check codes according to the present invention.

The block diagram in FIG. 8 illustrates a preferred embodiment of an overall decoder for a concatenated code. Specifically, the decoder shown in FIG. 8 illustrates an overall-iterative decoder that exchanges extrinsic information between a turbo decoder 120 and a parity-check decoder 122. Preferably, each of the decoders will use soft-input, soft-output algorithms. Moreover, each decoder is preferably an a posteriori probability (APP) decoder, or approximation of an APP decoder that provides information on the relative probabilities, log-likelihoods, or log-likelihood ratios of the bit decisions. For example, the decoders may be a Bahl-Cocke-Jelinek-Raviv (BCJR) or other maximum a posteriori (MAP) decoder, a log-MAP decoder, a log-max decoder, or some form of modified soft-output Viterbi algorithm (SOVA) decoder. Various permuters 126, 128 are usually required to rearrange the order of soft-decision symbols and extrinsic information to match the order in which bits or symbols were encoded by an encoder. In a preferred embodiment, the decoder accepts log-likelihood ratios or scaled versions of log-likelihood ratios for channel symbols, and outputs log-likelihood ratio estimates for systematic and redundancy bits of parity-check codes.

Operation of the overall decoder for concatenated codes shown in FIG. 8 will now be described. A set of log-likelihood ratios for the encoded data bits and an inverse permuted parity check extrinsic information are received at a turbo code decoder 120. The set of log-likelihoods include systematic symbols, which are log-likelihood ratios for the systematic bits. In addition, the systematic symbols are input to a permuter 128 and an adder 124. Using soft decision techniques, a first set of extrinsic information is outputted from the turbo decoder 120 and passed to an extrinsic information permuter 126 and the adder 124. The parity-check decoder 122 receives the permuted extrinsic information from the permuter 126 and the permuted systematic symbols from the permuter 128. The parity-check decoder 122 generates a second set of extrinsic information using soft decision techniques for iterative feedback to the turbo code decoder. The second set of extrinsic information is passed to an inverse permuter 130 that inverse permutes the second set of extrinsic information and sends the inverse permuted second set of extrinsic information to the turbo code decoder 120 and the adder 124. The adder 124 receives the systematic symbols, the first set of extrinsic information, and the inverse-permuted second set of parity-check extrinsic information, adds the received symbols and generates a set of decoder soft outputs. The decoded data bits are a set of decoder hard decisions that are made based on the signs of the decoder soft outputs, using a hard-decision device 132.

The overall-iterative decoding system and method described herein is one of the features that distinguishes this invention from previous techniques that utilize an outer code with an inner turbo code. Although Bose-Chaudhuri-Hochquenghem (BCH) and Reed-Solomon codes have been proposed as outer codes with turbo inner codes, BCH and Reed-Solomon codes are typically decoded using algebraic, hard-decision decoders that cannot be easily used in an overall-iterative configuration as implemented in the current invention. Furthermore, in previously proposed turbo inner code and outer code schemes, while the proposed outer codes may mitigate the effects of low-weight error events, previous overall coding designs cannot improve the convergence of the turbo decoder. Notably, in contrast to previous overall coding designs, the disclosed invention can potentially improve the convergence of the turbo decoder through soft-decision feedback from the decoder for the outer code. In addition, the present invention can also be analyzed through its overall weight enumerator and its convergence can be studied through techniques such as density evolution.

A. MAP Decoders

MAP decoder and variations for rectangular parity-check coder are discussed in J. Hagenauer, E. Offer, and L. Papke, "Iterative decoding of binary block and convolutional codes," *IEEE Transactions on Information Theory*, vol. 42, pp. 429445, March 1996. The estimation of a parameter related to the probability that that bit pattern was the bit pattern actually transmitted, or soft decision information, from the output of a turbo decoder is placed in a rectangular array. The soft-decision information for parity bits is placed in the appropriate places around the edges of an array. The decoder then operates iteratively on rows and then columns of the array. If iteration is used within the decoder for the rectangular parity-check code, then the decoder repeatedly decodes rows and columns. When decoding a row of bits, the extrinsic information for each bit is the information for that bit that is given by the other bits in that row. The derived extrinsic information can be considered to be a type of soft-decision parity of the other bits. When Log-MAP values are used, the log-MAP extrinsic information is an algebraic sum of the log-MAP values for all of the bits in the row, including the parity bit, excluding the current bit.

B. Stopping Overall Iterative Decoding

According to the invention, in an overall-iterative decoding scheme, the parity-check codes can be used to determine when to stop the iterative decoding. This is achieved by making hard-decisions in the parity-check decoder and determining if any errors are indicated by the parity-checks. If no errors are indicated, then this is an indication that no further iteration may be needed. This criterion may be combined with other criteria, such as setting upper and lower limits for the number of iterations, to form a stopping rule for the overall-iterative decoder.

C. Overall Non-iterative Decoding

Figure 9:
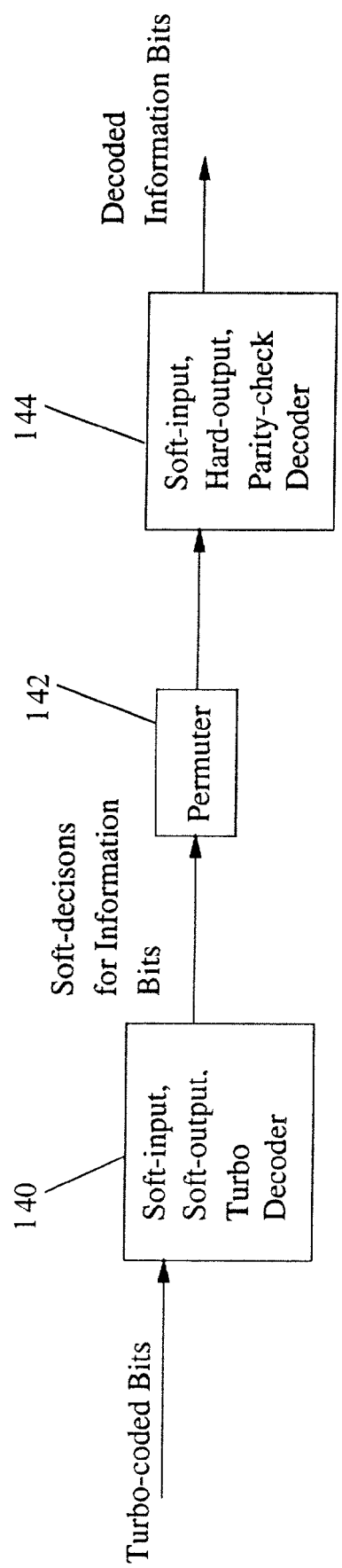
FIG. 9 is a block diagram that illustrates a decoder, according to the present invention, that does not iterate between the turbo code and the parity-check code.

The block diagram in FIG. 9 illustrates an overall-non-iterative decoding scheme. In this decoder, the turbo decoder 140 is run until completion, depending on the type of completion parameters selected. For example, completion could be determined by a maximum number of iterations or a minimum change in extrinsic information. Then, the soft outputs from the turbo decoder are permuted 142 and input to the parity-check decoder 144, which decodes the input and produces a hard output for the information bits. The parity-check decoder may be an iterative MAP decoder, such as the one described above, or it may be a non-iterative decoder, such as the simple decoder, which we describe below.

D. Simple Decoder

A hybrid iterative/non-iterative decoder configuration is also possible in which the parity-check decoders are iterated with the turbo code, but extrinsic information is only passed from the turbo decoder to the parity-check decoders, and not from the parity-check decoders to the turbo decoder. Typically this configuration would be used with some sort of error-detection method to reduce the number of turbo decoder iterations in comparison to the non-iterative method for some packets that can be corrected by the parity-check decoder.

Figure 10:
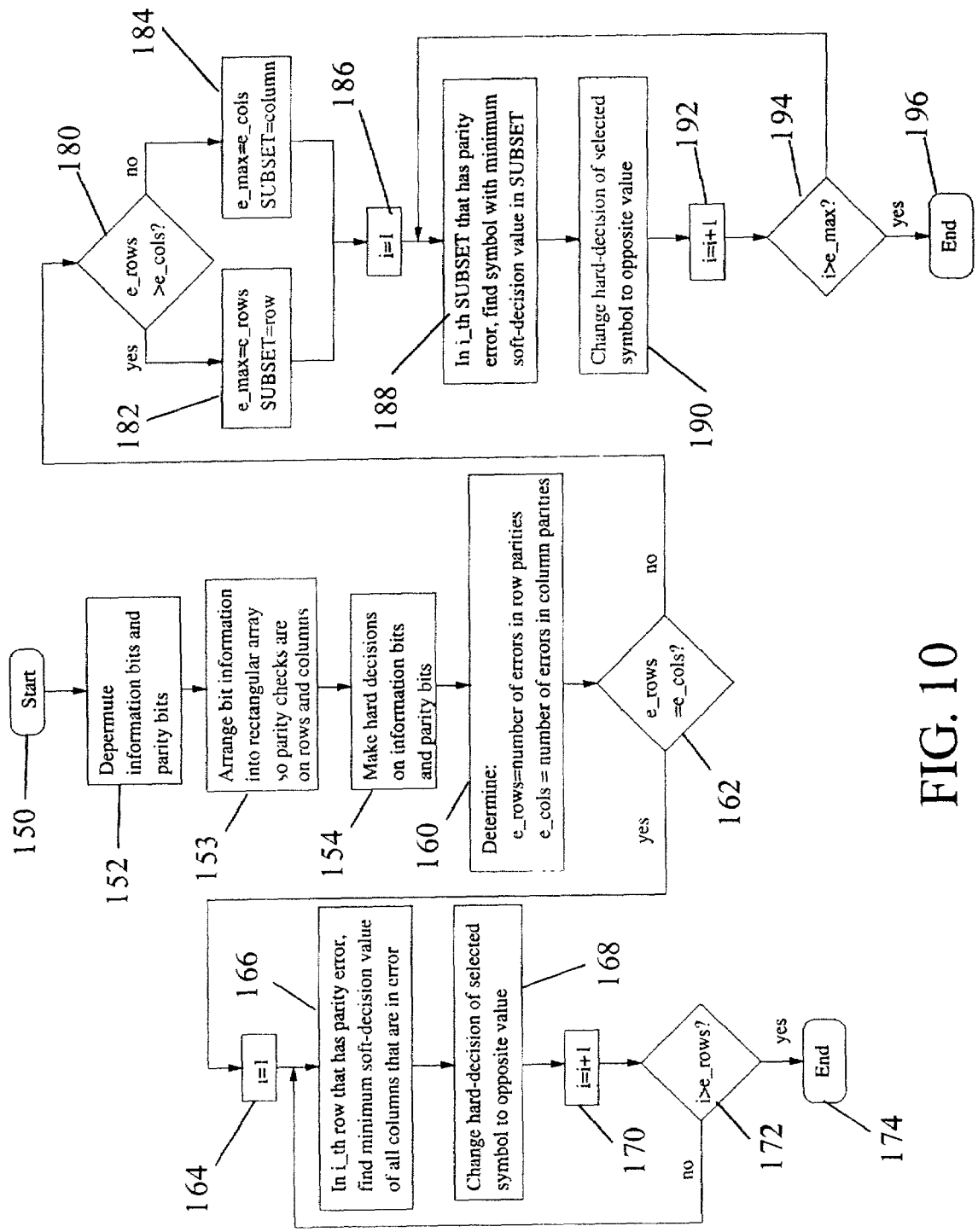
FIG. 10 illustrates a block diagram for a new decoding algorithm that is described in the present invention for use with the rectangular parity-check codes.
Figure 11:
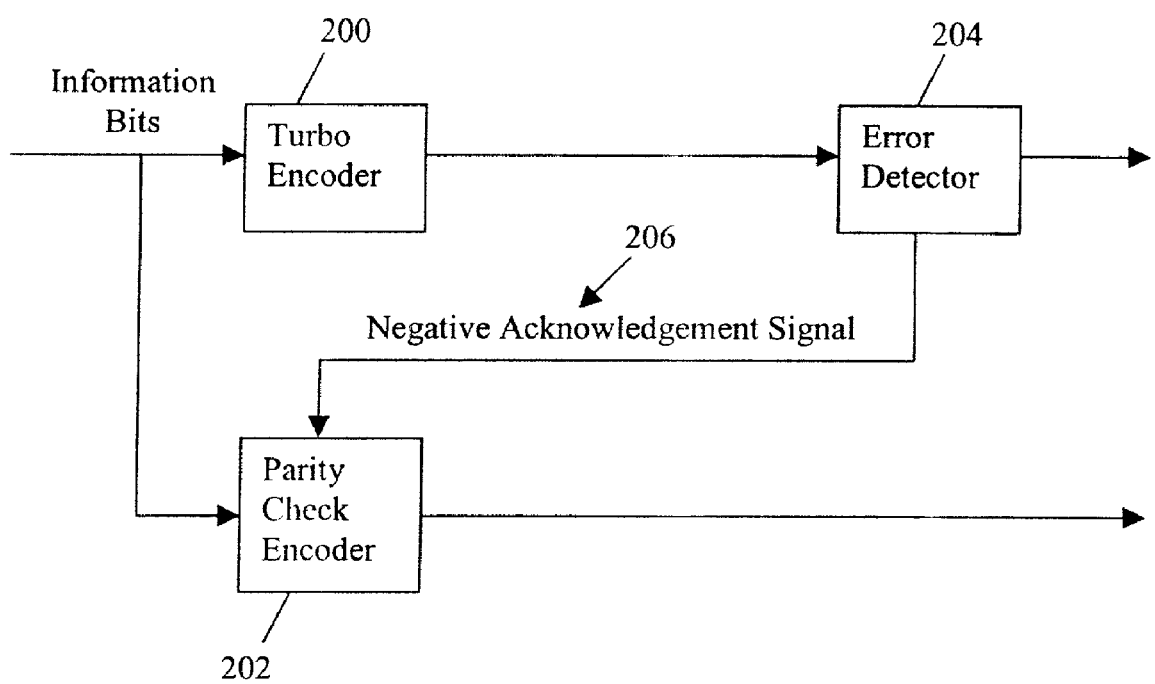
FIG. 11 illustrates a block diagram illustrating an embodiment of a hybrid automatic repeat request encoder.

The flow chart in FIG. 10 illustrates a simple decoder for use with the rectangular parity-check code. This simple decoder uses soft inputs, but uses a majority-logic type of decoding. Preferably, the rectangular parity array is actually square. The process starts 150 by de-permuting the information bits and parity bits 152. Then, the simple decoder places the hard-decision values for the information bits from the output of the turbo decoder into a square array 153. The simple decoder then calculates the horizontal and vertical parity bits based on these hard decisions, preferably using even parity 154. The calculated parity vectors are then added modulo two to the hard-decisions for the horizontal and vertical parity vectors from the output of the turbo decoder. Then the resulting parity bits are 1 for any row or column that is estimated to contain an odd number of errors and 0 in any row or column that is estimated to contain no errors or an even number of errors. The simple decoder then counts the number of 1's in the horizontal and vertical directions. A simple decoder according to this invention then tries to determine the positions of symbols that are in error at the output of the turbo code by examining the soft-decision values in the rows and columns in which errors are indicated. A non-iterative method of decoding is described below as an example of this type of decoder. Other more-complicated methods, such as those that use iterative decoding, may improve upon the performance of this decoder at the expense of additional complexity.

In a preferred embodiment using an even RPCC, the simple, non-iterative decoder continues the decoding process by determining whether the number of errors in row parities is the same as the number of column parity errors 160. The operation of this decoder depends on the relative values of the numbers of parity errors (the number of 1's as described above) in the rows and columns. If the numbers of 1's in the horizontal and vertical directions are equal 162, then for each 1 in the horizontal direction, the decoder finds the symbol with the minimum reliability (the symbol that has the smallest magnitude for its soft output from the turbo decodes) of all of the positions indicated by ones in the vertical direction. The hard-decision value for the selected bit is then changed to the opposite value. Specifically, a row counter is set to an initial value of 1 164, and an iterative loop is performed for each row of the array having a parity error. For the current row that has a parity error the minimum soft-decision value for all columns that are in error is found 166. Then if the current row has a parity error, the hard decision for the selected symbol is changed to the opposite symbol 168 and the row counter is incremented 170. When the counter exceeds the number of rows with parity errors 172, the loop terminates and processing ends 174.

Alternatively, if the numbers of 1's in the horizontal and vertical directions are different, then the decoder selects the direction with the maximum number of 1's 180. If the number of row parity errors are greater than the number of column parity errors, then a terminal value is set to the number of rows with parity errors and a search subset is declared to be a row 182. Alternatively, if the number of row parity errors are less than the number of column parity errors, then a terminal value is set to the number of columns with parity errors and a search subset is declared to be a column 184. Then, a counter is set to an initial value of 1 186, and an iterative loop is performed for the direction having the most parity errors, ignoring the 1's in the other direction. For each of the 1's in the maximum direction, the decoder searches over all of the entries in the indicated row or column to find the symbol with the minimum reliability 188. Once the symbol with the minimum reliability is located, the hard-decision value for the selected symbol is changed to the opposite value 190 and the counter is incremented 192. When the counter exceeds the terminal value 194, the loop terminates and processing ends 196.

E. Unequal Error Protection

The present invention may also be used to achieve unequal error protection, in which the probability of error may be significantly different for some bits at the output of the decoder than for other bits. This is useful in systems that convey multiple types of messages or messages with different classes of bits on a single packet. Examples of such messages include multi-resolution source-encoded speech or video. One way to achieve unequal error protection with the present invention is to use the parity code only on some subset of the information bits, such as 10% to 90% of the information bits, that are input to the turbo code. These bits will then have a lower probability of error at the output of the decoder.

V. Hybrid Automatic Repeat Request Encoding

The present invention may also be used with hybrid automatic repeat request (ARQ) encoding schemess, such as code combining. One way in which the present invention can be used is to encode the information bits with the parity-check code 202 in parallel with the turbo code 200. Then the parity-check bits computed by the parity-check code 202 are not sent unless a negative acknowledgment signal 206 is received from an error detector 204 for the encoded packet. The parity bits can then be sent in several ways, such as with another data packet, thus receiving error protection from the turbo code for that packet. The parity bits can then be used in several ways. For instance, they can be directly used in the overall-non-iterative decoding scheme. The parity bits can also be used in a decoding scheme that iterates simultaneously over both packets (the one that didn't decode correctly and the new packet that contains the parity bits). This code-combining ARQ technique can be used to substantially reduce the error floor for the turbo code while also reducing the overhead for the parity-check code because the parity-check bits are only transmitted when needed.

Figure 12:
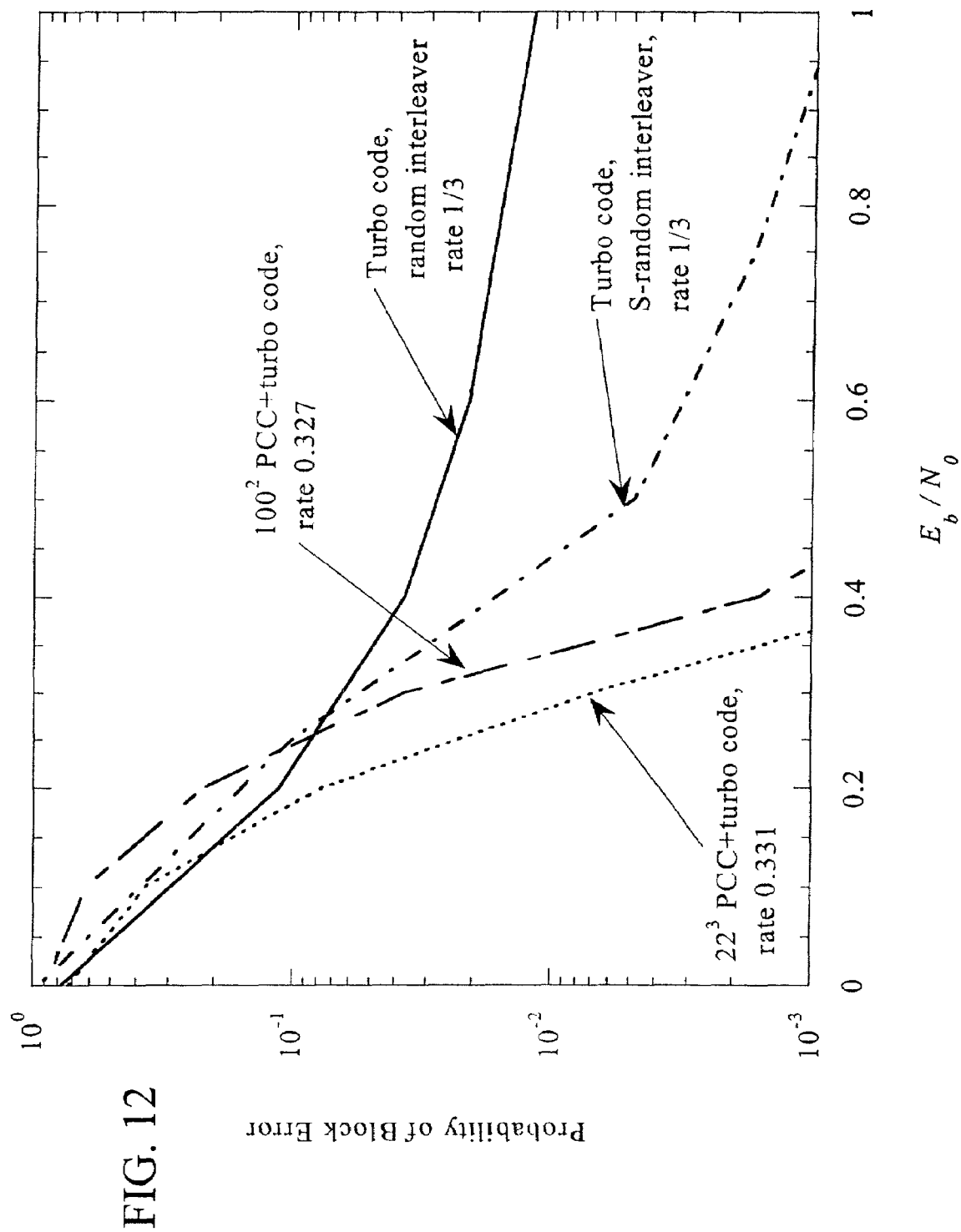
FIG. 12 is a graph illustrating the performance of concatenated parity check and turbo codes in relation to the performance of turbo codes only according to the present invention.
Figure 13:
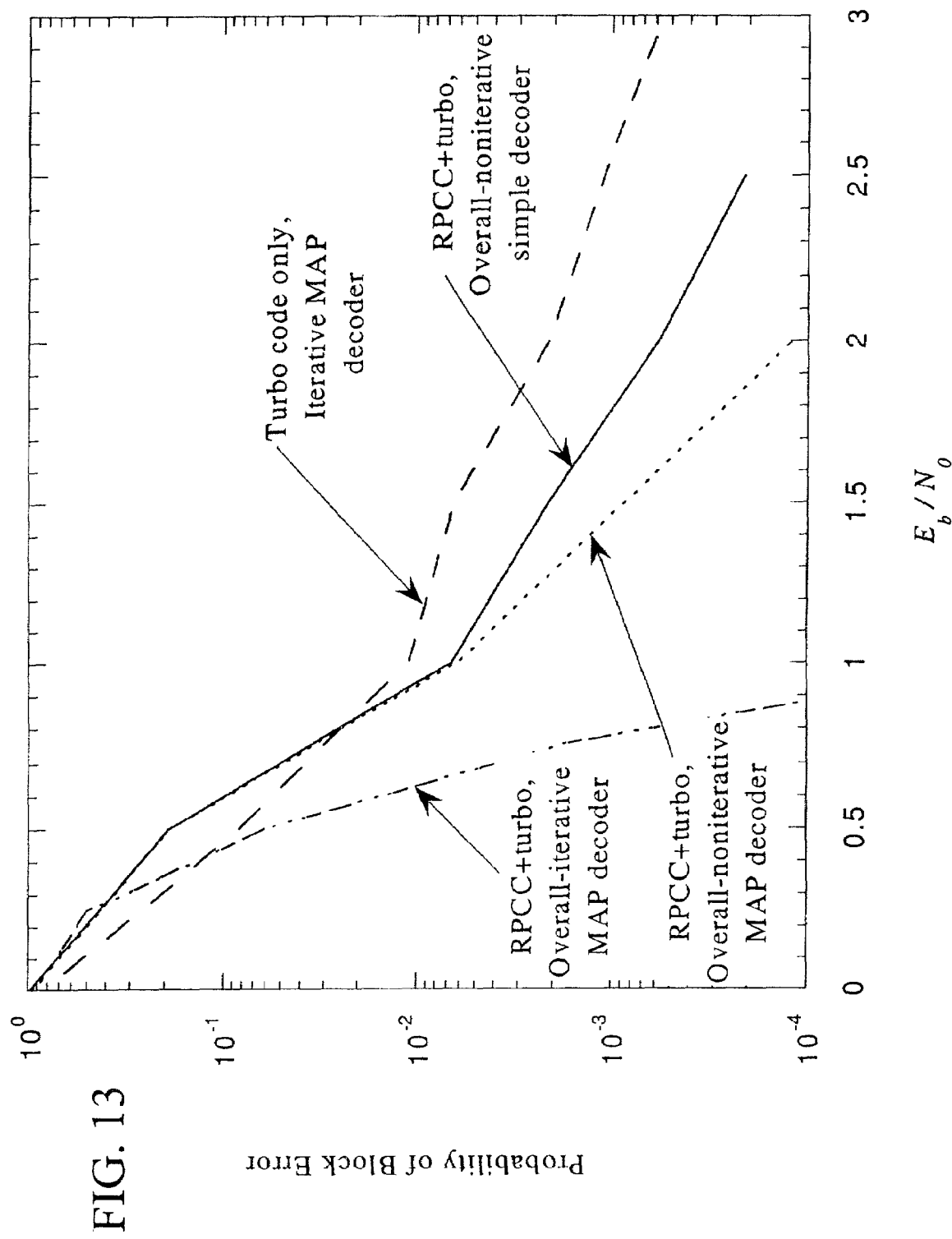
FIG. 13 is a graph illustrating the performance of concatenated rectangular parity check and turbo codes in relation to the performance of a turbo code only according to the present invention.

FIGS. 12 and 13 illustrate the advantageous block error performance of the proposed concatenated encoded schemes compared to the performance of turbo codes operating without a corresponding parity check code. In particular, FIG. 12 shows the performance of a turbo code having a random interleaver rate of 1/3 and a turbo code having an S-random interleaver rate of 1/3 where S=35, each encoding a 10,000 bit block. As shown, a concatenated $100^2$ Parity Check Code (PCC) and turbo code with the random interleaver and overall-iterative MAP decoding, operating at a rate of 0.327 and encoding 10,000 bits, outperforms the turbo codes alone, especially at probability of block error values less than $7 \times 10^{-1}$. Moreover, a concatenated $22^3$ Parity Check Code (PCC) and turbo code with the random interleaver and overall-iterative MAP decoding, operating at a rate of 0.331 and encoding 10,648 bits, provides superior performance compared to the depicted turbo codes alone.

In FIG. 13, the results for a 1/3 turbo code alone using an iterative MAP decoder for codes having an information length of 2500 are shown compared to concatenated RPCC and turbo codes using an overall noniterative simple decoder, an overall iterative MAP decoder and an overall noniterative MAP decoder, respectively. As can be seen, the concatenated RPCC and turbo codes provide improved probability of block error performance compared to using the turbo code alone.

Based on the foregoing specification, the invention may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware to create a computer system or computer subsystem embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention. User input may be received from the keyboard, mouse, pen, voice, touch screen, or any other means by which a human can input data into a computer, including through other programs such as application programs.

It should be understood that the examples and embodiments described herein are for illustrative purposes only and that various modifications or changes in light thereof will be suggested to persons skilled in the art and are to be included within the spirit and purview of this application.

REFERENCES

The following papers, describing error correcting schemes, are incorporated herein by reference to the extent they are not inconsistent with the disclosure, teachings, and principles of the subject invention.

C. Berrou, A. Glavieux, and P. Thitimajshima, "Near Shannon limit error-correcting coding and decoding," in *Proceedings* 1993 *IEEE International Conference on Communications*, (Geneva, Switzerland), pp. 1064–1070, 1993.

L. R. Bahl, J. Cocke, F. Jelinek, and J. Raviv, "Optimal decoding of linear codes for minimizing symbol error rate", *IEEE Transactions on Information Theory*, vol. IT-20, pp. 284–287, March 1997.

J. D. Andersen, "'Turbo'coding for deep space applications," in *Proceedings 1995 IEEE International Symposium on Information Theory*, (Whistler, British Columbia, Canada), p. 36, September 1995.

J. D. Andersen, "Turbo codes extended with outer BCH code," *IEE Electronics Letters*, vol. 32, pp. 2059–2060, October 1996.

K. R. Narayanan and G. L. Stuber, "Selective serial concatenation of turbo codes,"*IEEE Communications Letters*, vol. 1, pp. 136–139, September 1997.

H. C. Kim and P. J. Lee, "Performance of turbo codes with a single-error correcting bch outer code," in *Proceedings 2000 IEEE International Symposium on Information Theory*, (Sorrento, Italy), p. 369, June 2000.

O. Y. Takeshita, O. M. Collins, P. C. Massey, and J. D. J. Costello, "On the frame-error rate of concatenated turbo codes," *IEEE Transactions on Communications, vol.*49, pp. 602–608, April 2001.

D. J. Costello, Jr. and G. Meyerhans, "Concatenated turbo codes," in *Proceedings 1996 IEEE International Symposium on Information Theory and Its Applications*, (Victoria, Canada), pp. 571–574, September 1996.

M. C. Valenti, "Inserting turbo code technology into the DVB satellite broadcast system," in *Proceedings 2000 IEEE Military Communications Conference*, (Los Angeles), pp. 650–654, October 2000.

L. Ping, S. Chan, and K. L. Yeung, "Efficient soft-in-soft-out sub-optimal decoding rule for single parity-check codes," *IEE Electronics Letters*, vol. 33, pp. 1614–1616, September 1997.

L. Ping, S. Chan, and K. L. Yeung, "Iterative decoding of multi-dimensional concatenated single parity-check codes," in *Proceedings of the 1998 IEEE International Conference on Communications*, vol. 1, (Atlanta, Ga.), pp. 131–135, June 1998.

G. Caire, G. Taricco, and G. Battail, "Weight distribution and performance of the iterated product of single-parity-check codes," in *Proceedings of the 1994 IEEE Global Communications Conference*, pp. 206–211, 1994.

J. Hagenauer, E. Offer, and L. Papke, "Iterative decoding of binary block and convolutional codes," *IEEE Transactions on Information Theory*, vol. 42, pp. 429–445, March 1996.

T. F. Wong and J. M. Shea, "Multi-dimensional parity-check codes for bursty channels," in *Proceedings 2001 IEEE International Symposium on Information Theory*, (Washington, D.C.), p. 123, June 2001.

D. M. Rankin and T. A. Gulliver, "Single parity-check product codes," *IEEE Transactions on Communications*, vol. 49, pp. 1354–1362, August 2001.

J. M. Shea, "Improving the performance of turbo codes through concatenation with rectangular parity-check codes," in *Proceedings 2001 IEEE International Symposium on Information Theory*, (Washington, D.C.), p. 144, June 2001.

J. M. Shea and T. F. Wong, "Concatenated codes based on multidimensional parity-check codes and turbo codes," in *Proceedings of the 2001 IEEE Military Communications Conference*, (Washington, D.C.), vol.2, pp. 1152–1156, October 2001.

J. M. Shea and T. F. Wong, "Reduced-complexity decoding for concatenated codes based on rectangular parity-check codes and turbo codes," in *Proceedings of the 2001 IEEE Global Communications Conference*, (San Antonio, Tex.), pp. 1031–1035, November 2001.

J. Han and O. Y. Takeshita, "On the decoding structure for multiple codes," in *Proceedings if the 2001 IEEE International Symposium Information Theory*, (Washington, D.C.), p. 98, June 2001.

What is claimed is:

1. A method of error-correction for encoding a block of digital data by serially concatenating at least two error correcting codes, comprising:
   a. encoding a block of digital information bits using a concatenated parity-check code as an outer code to generate parity bits;
   b. multiplexing the parity bits with the information bits to create a product code;
   c. encoding the product code using a turbo code encoder as an inner code; and
   d. outputting a serially concatenated encoded data block.

2. The method of claim 1, wherein encoding a block of digital information bits using concatenated parity-check code further comprises encoding the block of digital data using a plurality of parity-check encoders operating in parallel, wherein each input to the parity-check encoder is separated from every other input of each parity-check encoder by a parity-check permitter.

3. The method of claim 2, wherein said parity-check permuter is pseudorandom.

4. The method of claim 2, wherein said parity-check permuter is deterministic.

5. The method of claim 1, wherein encoding a block of digital information bits using a concatenated parity-check code further comprises encoding the block of digital data using a plurality of parity-check encoders operating in series.

6. The method of claim 1, wherein the parity-check code is a rectangular parity-check code.

7. The method of claim 1, wherein the parity-check code is a multidimensional parity-check code.

8. The method of claim 1, wherein the product code is further permuted before being encoding by the turbo code.

9. The method of claim 1, wherein outputting a serially concatenated encoded data block further comprises permuting the encoded data block.

10. The method of claim 1 wherein outputting a serially concatenated encoded date block further comprises puncturing the encoded data block.

11. A method of permuting data between an outer rectangular parity-check code and an inner code for error correction to enhance the performance of an error correcting code by preventing entries in a permuted first rectangular array from ending up in the same row or column of a second array after permutation comprising:
   a. placing information bits from a block of digital data into a first rectangular array;
   b. creating a second rectangular array having the same number of rows and columns as said first ray;
   c. reading information bits from said first rectangular array along a diagonal and placing the information bits in a row or column of said second rectangular array;
   d. selecting a new diagonal in said first rectangular array and a new starting position in said second rectangular array so that no information bits that are in the same row or column of said first rectangular array are placed in the same row or column of said second rectangular array;
   e. if it is not possible to ensure that no information bits from said first rectangular array can be placed in a different row or column of said second rectangular array, then selecting a new diagonal in said first rectangular array and a new starting position in said second rectangular array so that the distance between the bit positions in said second rectangular array is maximized for bits that were in the same row or column in said first rectangular array; and f. repeating steps c. through e. until all of the information bits from said first rectangular array are placed in said second rectangular array.

12. A method of permuting data between an outer rectangular parity-check code and an inner code for error correction to enhance the performance of the error correcting code by preventing entries in a permuted first square array from ending up in the same row or column of a second square array after permutation comprising:

a. placing information bits from a block of digital data into a first square array;
  b. creating a second square array having the same number of rows and columns as said first array;
  c. establishing a first variable for storing a row position of an element in an array, establishing a second variable for storing a column position of an element in an array, establishing a first counter for storing values used in performing iterations, setting the first counter to a first initial value, establishing a first terminal counter value equal to the dimension of the first square array, and if the first counter value is not equal to said first terminal value, then iteratively performing the following steps c1 through c4:
  (c-1) establishing a second counter for storing values used in performing iterations, setting the second counter to a second initial value, establishing a second terminal counter value equal to the dimension of the first square array, and if the second counter value is not equal to said second terminal value, then iteratively performing the following steps c1a through c1d:
  (c-1-a) putting the current first array element into the current second array element location;
  (c-1-b) computing a new first variable by incrementing the current first variable by 1, modulus dimension of the first square array;
  (c-1-c) computing a new second variable by incrementing the current second variable by 1, modulus dimension of the first square array;
  (c-1-d) incrementing the second counter;
  (c-2) computing a new first variable by incrementing the current first variable by 2, modulus dimension of the first square array;
  (c-3) computing a new second variable by incrementing the current second variable by 1, modulus dimension of the first square array;
  (c-4) incrementing the first counter, and
  d. outputting a second array of shuffled elements.

13. A method of error correction decoding of serially concatenated error correcting codes using an overall iterative decoding process wherein a parity-check decoder and a turbo code decoder iteratively exchange soft decision information using soft decision feedback, comprising:

a. receiving soft inputs for the serially concatenated error correcting encoded data bits at a turbo-code decoder and outputting, using soft decision techniques, turbo decoded extrinsic information to a turbo-decoded extrinsic information permuter and an adder;
  b. permuting the turbo decoded extrinsic information and forwarding the permuted turbo decoded extrinsic information to a parity-check decoder;
  c. permuting the soft inputs for the systematic bits and forwarding the soft inputs for the systematic bits to a parity-check decoder;
  d. receiving the permuted turbo decoded extrinsic information and permuted soft inputs for the systematic bits at the parity-check decoder,
  e. generating parity-check decoder extrinsic information using soft-decision techniques for iterative feedback to the turbo code decoder;
  f. inverse permuting the parity-check decoder extrinsic information and sending the inverse permuted parity-check decoder extrinsic information to the turbo code decoder and the adder;
  g. receiving and adding the soft inputs for the systematic bits, the turbo decoded extrinsic information, and the parity-check decoder extrinsic information at the adder and generating a set of decoder soft outputs;
  h. receiving the adder decoder bits at a hard decision decoder and generating decoded data bits.

14. The method of claim 13, wherein the soft decision turbo decoder is an a posteriori probability (APP), Maximum a posteriori (MAP), Bahl-Cocke-Jelinek-Raviv (BCJR), log-MAP, log-max, or Viterbi soft decision turbo decoder.

15. The method of claim 13, wherein the soft decision parity-check decoder is an APP, MAP, BCJR, log-MAP, log-max, or Viterbi soft decision parity-check decoder.

16. The method of claim 13, wherein the soft decision parity-check decoder is a sub-optimal decoder comprising the use of minimums and second minimums.

17. The method of claim 13, wherein the iterative decoding of the serially concatenated parity-check and turbo code is stopped by making a hard decision in the parity-check decoder when no parity errors are detected.

18. A method of error correction decoding of serially concatenated error-correcting codes using a non-iterative decoding process between an internally iterating turbo code decoder and a parity-check decoder comprising:

a. receiving serially concatenated error correcting encoded data bits at a turbo code decoder,
  b. iteratively decoding the serially concatenated error correcting encoded data bit using soft decision techniques,
  c. outputting the turbo decoded soft decision information to a permuter;
  d. permuting the turbo decoded soft decision information and forwarding the permuted turbo decoded soft decision information to a parity-check decoder;
  e. receiving and decoding the permuted turbo decoded soft decision information at a parity-check decoder; and
  f. generating decoded information bits.

19. The method of claim 18, wherein the soft decision turbo decoder is an APP, MAP, BCJR, log-MAP, log-max, or Viterbi soft decision turbo decoder.

20. The method of claim 18, wherein the soft decision parity-check decoder is an APP, MAP, BCJR, log-MAP, log-max, or Viterbi soft decision parity-check decoder.

21. The method of claim 18, wherein the soft decision parity-check decoder is a sub-optimal decoder comprising the use of minimums and second minimums.

22. A method for decoding concatenated parity-check code and an internally iterating turbo codes passing soft decision information to the parity-check code, wherein the parity-check decoder is a simple decoder comprising:

a. receiving hard-decision values for information bits from a turbo code decoder;

b. receiving soft-decision values for information bits from a turbo code decoder;

c. receiving a first horizontal parity bit vector and a first vertical parity bit vector from the turbo code decoder;

d. placing the hard decision values for the received information bits into a rectangular parity-check array;

e. calculating a second horizontal parity bit vector and a second vertical parity bit vector based on the hard decision values in the first rectangular array, f. adding, using modulo two arithmetic, the calculated second horizontal parity bit vector and the second vertical parity bit vector with the first horizontal hard decision value vector and first vertical hard decision value vector and placing the results in a third horizontal parity bit vector and a third vertical parity bit vector; wherein the resulting parity bits are binary value 1 for any row or column in the first array containing an odd number of errors, and the resulting parity bits are binary value 0 for any row or column in the first array containing no errors or an even number of errors;

g. computing the number of binary value 1's in the third vertical parity bit vector, and computing the number of binary value 1's in the third horizontal parity vector;

h. estimating the positions of symbols output from the turbo code decoder that are in error by examining the soft-decision values in the rows and columns of the rectangular parity-check array according to the parity bits computed in the third vertical parity bit vector and the third horizontal parity bit;

i. correcting the positions of symbols output from the turbo code decoder that are in error; and j. generating decoded information bits.

23. The method according to claim 22, wherein the step of estimating the positions of symbols output from the turbo code decoder that are in error further comprises:

a. comparing the number of binary value 1's in the vertical column vector computed for all the rows of the with the number of binary value 1's computed in the horizontal row vector for all the columns in the second array;

b. if the number of binary value 1's computed for all the rows of the rectangular parity-check array is equal to the number of binary value 1's computed for all the columns in the rectangular parity-check array, establishing a first counter for storing values used in performing iterations, setting the first courter to an initial value, establishing a first terminal counter value equal to the number of rows in the rectangular parity-check array, and if the first counter value is not equal to said terminal value, then iteratively performing the following steps b1 through b3:

(b-1) if the current row has a parity error indicated in the third vertical parity bit vector, finding the minimum soft-decision value from all of the columns of the rectangular parity-check array that have a parity error indicated by a binary 1 in the associated horizontal parity bit vector;

(b-2) changing the hard decision value for the minimum soft decision value to the opposite value;

(b-3) incrementing the counter;

c. else if the number of binary value 1's computed for all the rows of the rectangular parity-cheek array is greater than the number of binary value 1's computed for all the columns in the rectangular parity-check array, establishing a second counter for storing values used in performing iterations, setting the second counter to an initial value, establishing second terminal courter value equal to the number of rows in the rectangular parity-check array, and if the second counter value is not equal to said terminal value, then iteratively performing the following steps c1 through c3:

(c-1) if the current row has a parity error indicated in the third vertical parity bit vector, finding the minimum soft decision value from all of the rows of the rectangular parity-cheek array that have a parity error indicated by a binary 1 in the associated vertical parity bit vector, (c-2) changing the hard decision value for the minimum soft decision value to the opposite value;

(c-3) incrementing the counter;

d. else establishing a third counter for storing values used in performing iterations, setting the third courter to an initial value, establishing third terminal courter value equal to the number of columns in the rectangular parity-check array, and if the third counter value is not equal to said terminal value, then iteratively performing the following steps d1 through d3:

(d-1) if the current column has a parity error indicated in the third vertical parity bit vector, finding the minimum soft decision value from all of the columns of the rectangular parity-check array that have a parity error indicated by a binary 1 in the associated horizontal parity bit vector;

(d-2) changing the hard decision value for the minimum soft-decision value to the opposite value; and (d-3) incrementing the counter.

24. The method of claim 22, wherein the rectangular array is square.

25. A method of error correction for encoding a block of digital data using at least two error correcting codes operating in parallel comprising:

a. encoding a block of digital information bits and generating parity bits using a parity-check encoder;

b. encoding the block of digital information bits in parallel with the parity-check encoder using a turbo encoder;

c. outputting a turbo code encoded data block;

d. detecting errors in the outputted turbo code encoded data block; and e. if errors are detected in the outputted turbo code encoded data block:
  i. generating a negative acknowledgement signal to the parity-check encoder; and
  ii. outputting the parity bits generated for the block of digital information bits by the parity-check encoder in response to the negative acknowledgement signal.

26. An apparatus for error correction encoding a block of digital data by serially concatenating at least two error correcting codes, comprising:

a. an outer-code parity-check encoder for encoding a block of digital information bits to generate parity bits;

b. a multiplexer for multiplexing the parity bits output from the parity-check encoder with the information bits to create a product code; and c. an inner code turbo code encoder for encoding the product code and outputting a serially concatenated encoded data block.

27. The apparatus of claim 26, wherein the parity-check encoder for encoding the block of digital data further comprises a plurality of parity-check encoders operating in parallel, wherein each input to the parity-check encoder is separated from every other input of each parity-check encoder by a parity-check permuter.

28. The apparatus of claim 27, wherein said parity-check permuter is pseudorandom.

29. The apparatus of claim 27, wherein said parity-check permuter is deterministic.

30. The apparatus of claim 26, wherein the parity-check encoder for encoding a block of digital information bits further comprises a plurality of parity-check encoders operating in series.

31. The apparatus of claim 26, wherein the parity-check encoder is a rectangular parity-check encoder.

32. The apparatus of claim 26, wherein the parity-check encoder is a multidimensional parity-check encoder.

33. The apparatus of claim 26, further comprising a permuter to permute the product code before the product code is encoded by the turbo encoder.

34. The apparatus of claim 26, further comprising a permuter to interleave the serially concatenated encoded data block before the encoded data block is transmitted over a communication channel.

35. The apparatus of claim 26, further comprising a puncturer to puncture a serially concatenated encoded date block before the encoded data block is transmitted over a communication channel.

36. An apparatus for permuting data between an outer rectangular parity-check code and an inner code for error correction to enhance the performance of an error correcting code by preventing entries in a permuted first rectangular array from ending up in the same row or column of a second array after permutation comprising:
  a. means for placing information bits from a block of digital data into a first rectangular array;
  b. means for creating a second rectangular array having the same number of rows and columns as said first array;
  c. means for reading information bits from said first rectangular array along a diagonal and placing the information bits in a row or column of said second rectangular array,
  d. means for selecting a new diagonal in said first rectangular array and a new starting position in said second rectangular array so that no information bits that are in the same row or column of said first rectangular array are placed in the same row or column of said second rectangular array;
  e. means for determining if it is not possible to ensure that no information bits from said first rectangular array can be placed in a different row or column of said second rectangular array, then selecting a new diagonal in said first rectangular array and a new starting position in said second rectangular array so that the distance between the bit positions in said second rectangular array is maximized for bits that were in the same row or column in said first rectangular array; and
  f. an iteration element capable of repeating steps c. through e. until all of the information bits from said first rectangular array are placed in said second rectangular array.

37. An apparatus for permuting data between an outer rectangular parity-check code and an inner code for error correction to enhance the performance of the error correcting code by preventing entries in a permuted first square array from ending up in the same row or column of a second square array after permutacion comprising:
  a. means for placing information bits from a block of digital data into a first square array;
  b. means for creating a second square array having the same number of rows and columns as said first array;
  c. means for establishing a first variable for storing a row position of an element in an array, establishing a second variable for storing a column position of an element in an array, establishing a first counter for storing values used in performing iterations, setting the first counter to a first initial value, establishing a first terminal counter value equal to the dimension of the first square array, and if the first counter value is not equal to said first terminal value, then iteratively performing the following steps c1 through c4
  (c-1) establishing a second counter for storing values used in performing iterations, setting the second counter to a second initial value, establishing a second terminal counter value equal to the dimension of the first square array, and if the second counter value is not equal to said second terminal value, then iteratively performing the following steps c1a through c1d:
  (c-1-a) putting the current first array element into the current second array element location;
  (c-1-b) computing a new first variable by incrementing the current first variable by 1, modulus dimension of the first square array;
  (c-1-c) computing a new second variable by incrementing the current second variable by 1, modulus dimension of the first square array;
  (c-1-d) incrementing the second counter;
  (c-2) computing a new first variable by incrementing the current first variable by 2, modulus dimension of the first square array;
  (c-3) computing a new second variable by incrementing the current second variable by 1, modulus dimension of the first square array;
  (c-4) incrementing the first counter; and
  d. means for outputting a second array of shuffled elements.

38. An apparatus for error correction decoding of serially coficatenated error correcting codes using an overall iterative decoding process wherein a parity-check decoder and a turbo code decoder iteratively exchange soft decision information using soft decision feedback, comprising:
  a. means for receiving soft inputs for the serially concatenated error-correcting encoded data and inverse permuted parity-check extrinsic information at a turbo code decoder and outputting, using soft decision techniques, turbo decoded extrinsic information to a turbo decoded extrinsic information permuter and an adder;
  b. means for permuting the turbo decoded extrinsic information and forwarding the permuted turbo decoded extrinsic information to a parity-check decoder;
  c. means for permuting the soft inputs for the systematic bits and forwarding the permuted soft inputs for the systematic bits to a parity-check decoder;
  d. means for receiving the permuted turbo decoded extrinsic information bits and permuted soft inputs for the systematic bits at the parity-check decoder;
  e. means for generating parity-check extrinsic information using soft decision techniques for iterative feedback to the turbo code decoder;
  f. means for inverse permuting the parity-check extrinsic information and sending the inverse permuted parity-check extrinsic information to the turbo code decoder and the adder;
  g. means for receiving and adding the soft inputs for the systematic bits, the turbo decoded extrinsic information, and the inverse-permuted parity-check decoder extrinsic information at the adder and generating decoder soft outputs;
  h. means for receiving the decoder soft outputs at a hard decision decoder and generating decoded data bits.

39. An apparatus for error correction decoding of serially concatenated error-correcting codes using a non-iterative decoding process between an internally iterating turbo code decoder and a parity-check decoder comprising:

a. means for receiving soft inputs for serially concatenated error-correcting encoded data bits at a turbo code decoder, b. means for iteratively decoding the soft inputs for the serially concatenated error correcting encoded data bit using soft-decision techniques, c. means for outputting the turbo decoded soft-decision outputs to a permuter;

d. means for pennuting the turbo-decoded soft-decision outputs and forwarding the permuted turbo-decoded soft-decision outputs to a parity-check decoder;

e. means for receiving and decoding the permuted turbo-decoded soft-decision outputs at a parity-check decoder; and f. means for generating decoded information bits.

40. An apparatus for decoding concatenated parity-check code and an internally iterating turbo code passing soft decision information to the parity-check code, wherein the parity-check decoder is a simple decoder comprising:

a. means for receiving hard-decision values for information bits from a turbo-code decoder;

b. means for receiving soft-decision values for information bits from a turbo-code decoder;

c. means for receiving a first horizontal parity bit vector and a first vertical parity bit vector from the turbo code decoder;

d. means for placing the hard decision values for the received information bits into a rectangular parity-check array;

e. means for calculating a second horizontal parity bit vector and a second vertical parity bit vector based on the hard decision values in the first rectangular array;

f. means for adding, using modulo two arithmetic, the calculated second horizontal parity bit vector and the second vertical parity bit vector with the first horizontal hard decision value vector and first vertical hard decision value vector and placing the results in a third horizontal patty parity bit vector and a third vertical parity bit vector; wherein the resulting parity bits are binary value 1 for any row or column in the first array containing an odd number of errors, and the resulting parity bits are binary value 0 for any row or column in the first array containing no errors or an even number of errors;

g. means for computing the number of binary value 1's in the third vertical parity bit vector, and computing the number of binary value 1's in the third horizontal parity vector;

h. means for estimating the positions of symbols output from the turbo code decoder that are in error by examining the soft decision values in the rows and columns of the rectangular parity-check array according to the parity bits computed in the third vertical parity bit vector and the third horizontal parity bit;

i. means for correcting the positions of symbols output from the turbo code decoder that are in error; and j. means for generating decoded information bits.

41. An apparatus according to claim 40, wherein the element for estimating the positions of symbols output from the turbo code decoder that are in error further comprises:

a. means for comparing the number of binary value 1's in the vertical column vector computed for all the rows of the with the number of binary value 1's computed in the horizontal row vector for all the columns in the second array;

b. means for determining if the number of binary value 1's computed for all the rows of the rectangular parity-check array is equal to the number of binary value 1's computed for all the columns in the rectangular parity-check array, establishing a first counter for storing values used in performing iterations, setting the first counter to an initial value, establishing a first terminal counter value equal to the number of rows in the rectangular parity-check array, and if the first counter value is not equal to said terminal value, then iteratively performing the following steps b1 through b3:

(b-1) if the current row has a parity error indicated in the third vertical parity bit vector, finding the minimum soft decision value from all of the columns of the rectangular parity-check array that have a parity error indicated by a binary 1 in the associated horizontal parity bit vector;

(b-2) changing the hard decision value for the minimum soft decision value to the opposite value;

(b-3) incrementing the counter;

c. means for determining if the number of binary value 1's computed for all the rows of the rectangular parity-check array is greater than the number of binary value 1's computed for all the columns in the rectangular parity-check array, establishing a second counter for storing values used in performing iterations, setting the second counter to an initial value, establishing second terminal counter value equal to the number of rows in the rectangular parity-check array, and if the second counter value is not equal to said terminal value, then iteratively performing the following steps c1 through c3:

(c-1) if the current row has a parity error indicated in the third vertical parity bit vector, finding the minimum soft decision value from all of the rows of the rectangular parity-check array that have a parity error indicated by a binary 1 in the associated vertical parity bit vector (c-2) changing the hard decision value for the minimum soft decision value to the opposite value;

(c-3) incrementing the counter;

d. means for establishing a third counter for storing values used in performing iterations, setting the third counter to an initial value, establishing third terminal counter value equal to the number of columns in the rectangular parity-check array, and if the third counter value is not equal to said terminal value, then iteratively performing the following steps d1 through d3:

(d-1) if the current column has a parity error indicated in the third vertical parity bit vector, finding the minimum soft decision value from all of the columns of the rectangular parity-check array that have a parity error indicated by a binary 1 in the associated horizontal parity bit vector;

(d-2) changing the hard decision value for the minimum soft decision value to the opposite value; and (d-3) incrementing the counter.

42. An apparatus for error correction encoding a block of digital data using at least two error correcting codes operating in parallel comprising:
 a. means for encoding a block of digital information bits and generating parity bits using a parity-check encoder;
 b. means for encoding the block of digital information bits in parallel with the parity-check encoder using a turbo encoder;
 c. means for outputting a turbo code encoded data block;
 d. means for detecting errors in the outputted turbo code encoded data block;
 e. means for determining if errors are detected in the outputted turbo code encoded data block and performing the following steps e1 through e2;
 (e-1) generating a negative acknowledgement signal to the parity-check encoder; and
 (e-2) outputting the parity bits generated for the block of digital information bits by the parity-check encoder in response to the negative acknowledgement signal.

* * * * *

UNITED STATES PATENT AND TRADEMARK OFFICE
CERTIFICATE OF CORRECTION

PATENT NO. : 7,093,179 B2
APPLICATION NO. : 10/102367
DATED : August 15, 2006
INVENTOR(S) : John Mark Shea It is certified that error appears in the above-identified patent and that said Letters Patent is hereby corrected as shown below:

Column 2,
Line 53, "Issue of*IEE*" should read --Issue of *IEE*--.
Line 61, "Costello et al" should read --Costello et al.--.

Column 3,
Line 1, "Caire et al" should read --Caire et al.--.
Lines 2, "Hagenauer et al." should read --Hagenauer et al.--.

Column 4,
Line 30, "It still yet another" should read --In still yet another--.

Column 7,
Line 26, "RPCC 4 and multiplexed" should read --RPCC 40 and multiplexed--.
Lines 33-34 "is also be punctured" should read --is also to be punctured--.
Line 38 "The RPCC 4 is a type" should read --The RPCC 40 is a type--.
Line 39 "In an RPCC 4" should read --In an RPCC 40--.
Line 41-42, "The RPCC 4" should read --The RPCC 40--.

Column 9,
Lines 16-17, "At then end of the diagonal" should read --At that end of the diagonal--.

Column 11,
Lines 29-30, "vol. 42, pp. 429445" should read --vol. 42, pp. 429-445--.

Column 13,
Line 39, "encoding schemess" should read --encoding schemes--.

Column 15,
Line 12, "G.L. Stuber" should read -- G.L. Stüber--.

Column 16,
Line 45, "encoded date block" should read --encoded data block--.

Column 18,
Line 63, "an internally iterating turbo codes" should read --internally iterating turbo codes--.

Column 21,
Lines 19-20, "encoded date block" should read --encoded data block--.

UNITED STATES PATENT AND TRADEMARK OFFICE
CERTIFICATE OF CORRECTION

PATENT NO. : 7,093,179 B2
APPLICATION NO. : 10/102367
DATED : August 15, 2006
INVENTOR(S) : John Mark Shea It is certified that error appears in the above-identified patent and that said Letters Patent is hereby corrected as shown below:

Column 22,
Lines 34-35, "serially coficatenated" should read --serially concatenated--.

Column 23,
Line 13, "d. means for pennuting" should read --d. means for permuting--.
Lines 44, "patty bit vector" should read --parity bit vector--.

Column 24,
Lines 2-3, "rows of the with the number of" should read --rows with the number of--.
Line 45, "by a binary 1" should read --by a binary 1--.

Signed and Sealed this

Twentieth Day of February, 2007

JON W. DUDAS
*Director of the United States Patent and Trademark Office*